US012690488B2

(12) United States Patent
Huang et al.

(10) Patent No.: US 12,690,488 B2
(45) Date of Patent: *Jul. 21, 2026

(54) CAVITY PACKAGES

(71) Applicant: ADEIA SEMICONDUCTOR BONDING TECHNOLOGIES INC., San Jose, CA (US)

(72) Inventors: Shaowu Huang, Sunnyvale, CA (US); Javier A. DeLaCruz, San Jose, CA (US); Liang Wang, Milpitas, CA (US); Rajesh Katkar, Milpitas, CA (US); Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 491 days.

This patent is subject to a terminal disclaimer.

(21) Appl. No.: 18/147,239

(22) Filed: Dec. 28, 2022

(65) Prior Publication Data

US 2023/0260858 A1    Aug. 17, 2023

Related U.S. Application Data

(60) Continuation of application No. 17/146,304, filed on Jan. 11, 2021, now Pat. No. 11,600,542, which is a
(Continued)

(51) Int. Cl.
*H10W 76/60*        (2026.01)
*H10W 44/20*        (2026.01)
(Continued)

(52) U.S. Cl.
CPC ........... *H10W 76/60* (2026.01); *H10W 44/20* (2026.01); *H10W 76/12* (2026.01);
(Continued)

(58) Field of Classification Search
None
See application file for complete search history.

(56) References Cited

U.S. PATENT DOCUMENTS

| | | | |
|---|---|---|---|
| 4,998,665 | A | 3/1991 | Hayashi |
| 5,087,585 | A | 2/1992 | Hayashi |
| (Continued) | | | |

FOREIGN PATENT DOCUMENTS

| | | |
|---|---|---|
| CN | 101554988 | 10/2009 |
| CN | 104779243 A | 7/2015 |
| (Continued) | | |

OTHER PUBLICATIONS

Michailos, Jean, "Future landscape for 3D Integration: from Interposers to 3D High Density," 3d ASIP—Dec. 13-15, 2016, San Francisco Airport, USA, 46 pages.
(Continued)

*Primary Examiner* — Michelle Mandala
(74) *Attorney, Agent, or Firm* — Knobbe, Martens, Olson & Bear, LLP

(57)        ABSTRACT

An integrated device package is disclosed. The integrated device package can include an integrated device die, an element, a cavity, and an electrical interconnect. The element can have an antenna structure. The element can be attached to a surface of the integrated device. The cavity can be disposed between the integrated device die and the antenna structure. The electrical interconnect can connect the integrated device die and the antenna structure.

20 Claims, 12 Drawing Sheets

Related U.S. Application Data division of application No. 16/212,471, filed on Dec. 6, 2018, now Pat. No. 10,923,408.

(60) Provisional application No. 62/609,682, filed on Dec. 22, 2017.

(51) Int. Cl.

| *H10W 76/12* | (2026.01) |
|---|---|
| *H10W 74/00* | (2026.01) |

(52) U.S. Cl.
CPC ........ *H10W 44/209* (2026.01); *H10W 44/248* (2026.01); *H10W 74/00* (2026.01)

(56) References Cited

U.S. PATENT DOCUMENTS

| | | | |
|---|---|---|---|
| 5,322,593 | A | 6/1994 | Hasegawa et al. |
| 5,753,536 | A | 5/1998 | Sugiyama et al. |
| 5,771,555 | A | 6/1998 | Eda et al. |
| 5,985,739 | A | 11/1999 | Plettner et al. |
| 5,998,808 | A | 12/1999 | Matsushita |
| 6,008,126 | A | 12/1999 | Leedy |
| 6,080,640 | A | 6/2000 | Gardner et al. |
| 6,265,775 | B1 | 7/2001 | Seyyedy |
| 6,374,770 | B1 | 4/2002 | Lee |
| 6,423,640 | B1 | 7/2002 | Lee et al. |
| 6,465,892 | B1 | 10/2002 | Suga |
| 6,872,984 | B1 | 3/2005 | Leung |
| 6,876,062 | B2 | 4/2005 | Lee et al. |
| 6,887,769 | B2 | 5/2005 | Kellar et al. |
| 6,908,027 | B2 | 6/2005 | Tolchinsky et al. |
| 6,998,712 | B2 | 2/2006 | Okada et al. |
| 7,045,453 | B2 | 5/2006 | Canaperi et al. |
| 7,057,274 | B2 | 6/2006 | Heschel |
| 7,078,811 | B2 | 7/2006 | Suga |
| 7,105,980 | B2 | 9/2006 | Abbott et al. |
| 7,193,423 | B1 | 3/2007 | Dalton et al. |
| 7,354,798 | B2 | 4/2008 | Pogge et al. |
| 7,359,591 | B2 | 4/2008 | Vandentop et al. |
| 7,388,281 | B2 | 6/2008 | Krueger et al. |
| 7,467,897 | B2 | 12/2008 | Hauffe et al. |
| 7,622,324 | B2 | 11/2009 | Enquist et al. |
| 7,750,488 | B2 | 7/2010 | Patti et al. |
| 7,768,133 | B2 | 8/2010 | Matsui et al. |
| 7,803,693 | B2 | 9/2010 | Trezza |
| 7,972,683 | B2 | 7/2011 | Gudeman et al. |
| 8,183,127 | B2 | 5/2012 | Patti et al. |
| 8,191,756 | B2 | 6/2012 | Coppeta et al. |
| 8,241,961 | B2 | 8/2012 | Kim et al. |
| 8,269,671 | B2 | 9/2012 | Chen et al. |
| 8,314,007 | B2 | 11/2012 | Vaufredaz |
| 8,349,635 | B1 | 1/2013 | Gan et al. |
| 8,357,931 | B2 | 1/2013 | Schieck et al. |
| 8,377,798 | B2 | 2/2013 | Peng et al. |
| 8,395,229 | B2 | 3/2013 | Garcia-Blanco et al. |
| 8,411,444 | B2 | 4/2013 | Gaynes et al. |
| 8,441,131 | B2 | 5/2013 | Ryan |
| 8,476,146 | B2 | 7/2013 | Chen et al. |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,530,997 | B1 | 9/2013 | Yang et al. |
| 8,546,928 | B2 | 10/2013 | Merz et al. |
| 8,575,748 | B1 | 11/2013 | Farino |
| 8,620,164 | B2 | 12/2013 | Heck et al. |
| 8,647,987 | B2 | 2/2014 | Yang et al. |
| 8,669,602 | B2 | 3/2014 | Hayashi |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,916,448 | B2 | 12/2014 | Cheng et al. |
| 8,988,299 | B2 | 3/2015 | Kam et al. |
| 9,093,350 | B2 | 7/2015 | Endo et al. |
| 9,119,313 | B2 | 8/2015 | Zhang et al. |
| 9,142,517 | B2 | 9/2015 | Liu et al. |
| 9,142,532 | B2 | 9/2015 | Suga et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,318,471 | B2 | 4/2016 | Kabe et al. |
| 9,337,235 | B2 | 5/2016 | Chen et al. |
| 9,368,866 | B2 | 6/2016 | Yu |
| 9,385,024 | B2 | 7/2016 | Tong et al. |
| 9,386,688 | B2 | 7/2016 | MacDonald et al. |
| 9,391,143 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,601,454 | B2 | 3/2017 | Zhao et al. |
| 9,620,464 | B2 | 4/2017 | Baks et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,768,307 | B2 | 9/2017 | Yamazaki et al. |
| 9,799,587 | B2 | 10/2017 | Fujii et al. |
| 9,834,435 | B1 | 12/2017 | Liu et al. |
| 9,852,988 | B2 | 12/2017 | Enquist et al. |
| 9,881,882 | B2 | 1/2018 | Hsu et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,546,832 | B2 | 1/2020 | Wang et al. |
| 10,615,133 | B2 | 4/2020 | Kamgaing et al. |
| 10,658,312 | B2 | 5/2020 | Kamgaing et al. |
| 10,707,087 | B2 | 7/2020 | Uzoh et al. |
| 10,727,219 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,207 | B2 | 12/2020 | Wang et al. |
| 10,879,210 | B2 | 12/2020 | Enquist et al. |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 * | 2/2021 | Huang .................... H01L 23/66 |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |

(56)                References Cited

U.S. PATENT DOCUMENTS

| 10,998,292 | B2 | 5/2021 | Lee et al. |
| 11,004,757 | B2 | 5/2021 | Katkar et al. |
| 11,011,503 | B2 | 5/2021 | Wang et al. |
| 11,031,285 | B2 | 6/2021 | Katkar et al. |
| 11,056,348 | B2 | 7/2021 | Theil |
| 11,088,099 | B2 | 8/2021 | Katkar et al. |
| 11,127,738 | B2 | 9/2021 | DeLaCruz et al. |
| 11,158,606 | B2 | 10/2021 | Gao et al. |
| 11,171,117 | B2 | 11/2021 | Gao et al. |
| 11,176,450 | B2 | 11/2021 | Teig et al. |
| 11,205,600 | B2 | 12/2021 | Shen et al. |
| 11,256,004 | B2 | 2/2022 | Haba et al. |
| 11,257,727 | B2 | 2/2022 | Katkar et al. |
| 11,264,357 | B1 | 3/2022 | DeLaCruz et al. |
| 11,276,676 | B2 | 3/2022 | Enquist et al. |
| 11,329,034 | B2 | 5/2022 | Tao et al. |
| 11,348,898 | B2 | 5/2022 | DeLaCruz et al. |
| 11,355,443 | B2 | 6/2022 | Huang et al. |
| 11,380,597 | B2 | 7/2022 | Katkar et al. |
| 11,417,576 | B2 | 8/2022 | Katkar et al. |
| 11,485,670 | B2 | 11/2022 | Ruben et al. |
| 11,600,542 | B2 | 3/2023 | Huang et al. |
| 11,670,615 | B2 | 6/2023 | Wang et al. |
| 11,948,847 | B2 | 4/2024 | Katkar et al. |
| 11,955,393 | B2 | 4/2024 | Katkar et al. |
| 12,100,684 | B2 | 9/2024 | Wang et al. |
| 12,322,667 | B2 | 6/2025 | Katkar et al. |
| 12,374,641 | B2 | 7/2025 | Katkar et al. |
| 12,381,119 | B2 | 8/2025 | Katkar et al. |
| 2002/0000328 | A1 | 1/2002 | Motomura et al. |
| 2002/0003307 | A1 | 1/2002 | Suga |
| 2002/0094608 | A1 | 7/2002 | Brooks |
| 2002/0179921 | A1 | 12/2002 | Cohn |
| 2003/0098060 | A1 | 5/2003 | Yoshimi |
| 2004/0084414 | A1 | 5/2004 | Sakai et al. |
| 2004/0259325 | A1 | 12/2004 | Gan |
| 2005/0009246 | A1 | 1/2005 | Enquist et al. |
| 2005/0082653 | A1 | 4/2005 | McWilliams et al. |
| 2005/0263866 | A1 | 12/2005 | Wan |
| 2006/0001123 | A1 | 1/2006 | Heck et al. |
| 2006/0057945 | A1 | 3/2006 | Hsu et al. |
| 2006/0097335 | A1 | 5/2006 | Kim et al. |
| 2006/0115323 | A1 | 6/2006 | Coppeta et al. |
| 2006/0197215 | A1 | 9/2006 | Potter |
| 2006/0208326 | A1 | 9/2006 | Nasiri et al. |
| 2007/0029562 | A1 | 2/2007 | Koizumi |
| 2007/0045781 | A1 | 3/2007 | Carlson et al. |
| 2007/0045795 | A1 | 3/2007 | McBean |
| 2007/0075835 | A1* | 4/2007 | Robadey ............ G06K 19/0723 |
|  |  |  | 340/572.7 |
| 2007/0096294 | A1 | 5/2007 | Ikeda et al. |
| 2007/0111386 | A1 | 5/2007 | Kim et al. |
| 2007/0134891 | A1 | 6/2007 | Adetutu et al. |
| 2007/0171075 | A1* | 7/2007 | Ryu ................. G06K 19/07758 |
|  |  |  | 340/572.8 |
| 2007/0188054 | A1 | 8/2007 | Hasken et al. |
| 2007/0222048 | A1 | 9/2007 | Huang |
| 2007/0295456 | A1 | 12/2007 | Gudeman et al. |
| 2008/0080832 | A1 | 4/2008 | Chen et al. |
| 2008/0124835 | A1 | 5/2008 | Chen et al. |
| 2008/0157284 | A1 | 7/2008 | Chang |
| 2008/0261344 | A1 | 10/2008 | Jafri et al. |
| 2008/0283995 | A1 | 11/2008 | Bucki et al. |
| 2008/0290490 | A1 | 11/2008 | Fujii et al. |
| 2008/0296709 | A1 | 12/2008 | Haba et al. |
| 2009/0053855 | A1 | 2/2009 | Summers |
| 2009/0186446 | A1 | 7/2009 | Kwon et al. |
| 2009/0267165 | A1 | 10/2009 | Okudo et al. |
| 2010/0078786 | A1 | 4/2010 | Maeda |
| 2010/0096713 | A1 | 4/2010 | Jung |
| 2010/0148341 | A1 | 6/2010 | Fuji et al. |
| 2010/0181676 | A1 | 7/2010 | Montez et al. |
| 2010/0252898 | A1 | 10/2010 | Tanaka et al. |
| 2010/0288525 | A1 | 11/2010 | Basavanhally et al. |
| 2010/0301432 | A1 | 12/2010 | Kittilsland et al. |

| 2010/0314149 | A1 | 12/2010 | Gerrish et al. |
| 2011/0031633 | A1 | 2/2011 | Hsu et al. |
| 2011/0115092 | A1 | 5/2011 | Tago |
| 2011/0147859 | A1 | 6/2011 | Tanaka et al. |
| 2011/0156242 | A1 | 6/2011 | Sakaguchi et al. |
| 2011/0180921 | A1 | 7/2011 | Loiselet |
| 2011/0290552 | A1 | 12/2011 | Palmateer et al. |
| 2012/0061776 | A1 | 3/2012 | Cheng et al. |
| 2012/0097733 | A1 | 4/2012 | Ebefors et al. |
| 2012/0100657 | A1 | 4/2012 | Di Cioccio et al. |
| 2012/0112335 | A1 | 5/2012 | Ebefors et al. |
| 2012/0142144 | A1 | 6/2012 | Taheri |
| 2012/0212384 | A1 | 8/2012 | Kam et al. |
| 2012/0267730 | A1 | 10/2012 | Renard et al. |
| 2012/0286380 | A1 | 11/2012 | Yazdi et al. |
| 2012/0326248 | A1 | 12/2012 | Daneman et al. |
| 2013/0099331 | A1 | 4/2013 | Chen et al. |
| 2013/0122702 | A1 | 5/2013 | Volant et al. |
| 2013/0181877 | A1* | 7/2013 | Meilland .................. H01Q 7/08 |
|  |  |  | 29/601 |
| 2013/0187245 | A1 | 7/2013 | Chien et al. |
| 2013/0271066 | A1 | 10/2013 | Signorelli et al. |
| 2013/0277774 | A1 | 10/2013 | Frey et al. |
| 2013/0277777 | A1 | 10/2013 | Chang et al. |
| 2013/0293428 | A1 | 11/2013 | Souriau et al. |
| 2014/0042593 | A1 | 2/2014 | Mauder et al. |
| 2014/0175655 | A1 | 6/2014 | Chen et al. |
| 2014/0197534 | A1 | 7/2014 | Partosa et al. |
| 2014/0217557 | A1 | 8/2014 | Chen et al. |
| 2014/0225206 | A1 | 8/2014 | Lin et al. |
| 2014/0225795 | A1 | 8/2014 | Yu |
| 2014/0264653 | A1 | 9/2014 | Cheng et al. |
| 2014/0361413 | A1 | 12/2014 | Chapelon |
| 2015/0001632 | A1 | 1/2015 | Liu et al. |
| 2015/0021785 | A1 | 1/2015 | Lin |
| 2015/0064498 | A1 | 3/2015 | Tong |
| 2015/0068666 | A1 | 3/2015 | Abe et al. |
| 2015/0091153 | A1 | 4/2015 | Liu et al. |
| 2015/0097215 | A1 | 4/2015 | Chu et al. |
| 2015/0137345 | A1 | 5/2015 | Choi et al. |
| 2015/0298965 | A1 | 10/2015 | Tsai et al. |
| 2015/0336790 | A1 | 11/2015 | Geen et al. |
| 2015/0336792 | A1 | 11/2015 | Huang et al. |
| 2016/0002029 | A1 | 1/2016 | Nasiri et al. |
| 2016/0016789 | A1 | 1/2016 | Yu et al. |
| 2016/0107881 | A1 | 4/2016 | Thompson et al. |
| 2016/0137492 | A1 | 5/2016 | Cheng et al. |
| 2016/0146851 | A1 | 5/2016 | Kamisuki |
| 2016/0229685 | A1 | 8/2016 | Boysel |
| 2016/0240495 | A1 | 8/2016 | Lachner et al. |
| 2016/0318757 | A1 | 11/2016 | Chou et al. |
| 2016/0343682 | A1 | 11/2016 | Kawasaki |
| 2017/0001858 | A1 | 1/2017 | Adams et al. |
| 2017/0008757 | A1 | 1/2017 | Cheng et al. |
| 2017/0062366 | A1 | 3/2017 | Enquist |
| 2017/0081181 | A1 | 3/2017 | Zhang et al. |
| 2017/0135240 | A1 | 5/2017 | Pahl |
| 2017/0137281 | A1 | 5/2017 | Favier et al. |
| 2017/0186732 | A1 | 6/2017 | Chu et al. |
| 2017/0194271 | A1 | 7/2017 | Hsu et al. |
| 2017/0200711 | A1 | 7/2017 | Uzoh et al. |
| 2017/0305738 | A1 | 10/2017 | Chang et al. |
| 2017/0338214 | A1 | 11/2017 | Uzoh et al. |
| 2018/0044175 | A1 | 2/2018 | Ogashiwa et al. |
| 2018/0047682 | A1 | 2/2018 | Chang et al. |
| 2018/0096931 | A1 | 4/2018 | Huang et al. |
| 2018/0174995 | A1 | 6/2018 | Wang et al. |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190580 | A1 | 7/2018 | Haba et al. |
| 2018/0190583 | A1 | 7/2018 | DeLaCruz et al. |
| 2018/0191047 | A1 | 7/2018 | Huang et al. |
| 2018/0219038 | A1 | 8/2018 | Gambino et al. |
| 2018/0226375 | A1 | 8/2018 | Enquist et al. |
| 2018/0269161 | A1 | 9/2018 | Wu et al. |
| 2018/0273377 | A1 | 9/2018 | Katkar et al. |
| 2018/0286805 | A1 | 10/2018 | Huang et al. |
| 2018/0323177 | A1 | 11/2018 | Yu et al. |

(56) References Cited

U.S. PATENT DOCUMENTS

| | | | |
|---|---|---|---|
| 2018/0323227 A1 | 11/2018 | Zhang et al. | |
| 2018/0331066 A1 | 11/2018 | Uzoh et al. | |
| 2018/0337157 A1 | 11/2018 | Wang et al. | |
| 2019/0051628 A1 | 2/2019 | Liu et al. | |
| 2019/0057924 A1* | 2/2019 | Kim | H01L 24/17 |
| 2019/0096741 A1 | 3/2019 | Uzoh et al. | |
| 2019/0096842 A1 | 3/2019 | Fountain, Jr. et al. | |
| 2019/0115277 A1 | 4/2019 | Yu et al. | |
| 2019/0131277 A1 | 5/2019 | Yang et al. | |
| 2019/0164914 A1 | 5/2019 | Hu et al. | |
| 2019/0198407 A1 | 6/2019 | Huang et al. | |
| 2019/0198409 A1 | 6/2019 | Katkar et al. | |
| 2019/0265411 A1 | 8/2019 | Huang et al. | |
| 2019/0333550 A1 | 10/2019 | Fisch | |
| 2019/0348336 A1 | 11/2019 | Katkar et al. | |
| 2019/0363079 A1 | 11/2019 | Thei et al. | |
| 2019/0385935 A1 | 12/2019 | Gao et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0035641 A1 | 1/2020 | Fountain, Jr. et al. | |
| 2020/0043817 A1 | 2/2020 | Shen et al. | |
| 2020/0075520 A1 | 3/2020 | Gao et al. | |
| 2020/0075534 A1 | 3/2020 | Gao et al. | |
| 2020/0075553 A1 | 3/2020 | DeLaCruz et al. | |
| 2020/0118973 A1 | 4/2020 | Wang et al. | |
| 2020/0126906 A1 | 4/2020 | Uzoh et al. | |
| 2020/0131028 A1 | 4/2020 | Cheng et al. | |
| 2020/0140267 A1 | 5/2020 | Katkar et al. | |
| 2020/0140268 A1 | 5/2020 | Katkar et al. | |
| 2020/0144217 A1 | 5/2020 | Enquist et al. | |
| 2020/0194396 A1 | 6/2020 | Uzoh | |
| 2020/0227367 A1 | 7/2020 | Haba et al. | |
| 2020/0243380 A1 | 7/2020 | Uzoh et al. | |
| 2020/0279821 A1 | 9/2020 | Haba et al. | |
| 2020/0294908 A1 | 9/2020 | Haba et al. | |
| 2020/0328162 A1 | 10/2020 | Haba et al. | |
| 2020/0328164 A1 | 10/2020 | DeLaCruz et al. | |
| 2020/0328165 A1 | 10/2020 | DeLaCruz et al. | |
| 2020/0335408 A1 | 10/2020 | Gao et al. | |
| 2020/0371154 A1 | 11/2020 | DeLaCruz et al. | |
| 2020/0395306 A1 | 12/2020 | Chen et al. | |
| 2020/0395321 A1 | 12/2020 | Katkar et al. | |
| 2020/0411483 A1 | 12/2020 | Uzoh et al. | |
| 2021/0028534 A1* | 1/2021 | Liu | H01L 23/66 |
| 2021/0098412 A1 | 4/2021 | Haba et al. | |
| 2021/0118864 A1 | 4/2021 | DeLaCruz et al. | |
| 2021/0134689 A1 | 5/2021 | Huang et al. | |
| 2021/0143125 A1 | 5/2021 | DeLaCruz et al. | |
| 2021/0181510 A1 | 6/2021 | Katkar et al. | |
| 2021/0193603 A1 | 6/2021 | Katkar et al. | |
| 2021/0193624 A1 | 6/2021 | DeLaCruz et al. | |
| 2021/0193625 A1 | 6/2021 | DeLaCruz et al. | |
| 2021/0202428 A1 | 7/2021 | Wang et al. | |
| 2021/0242152 A1 | 8/2021 | Fountain, Jr. et al. | |
| 2021/0265227 A1 | 8/2021 | Katkar et al. | |
| 2021/0287977 A1 | 9/2021 | Mok | |
| 2021/0296282 A1 | 9/2021 | Gao et al. | |
| 2021/0305202 A1 | 9/2021 | Uzoh et al. | |
| 2021/0366820 A1 | 11/2021 | Uzoh | |
| 2021/0366876 A1 | 11/2021 | Yoo et al. | |
| 2021/0407941 A1 | 12/2021 | Haba | |
| 2022/0077063 A1 | 3/2022 | Haba | |
| 2022/0077087 A1 | 3/2022 | Haba | |
| 2022/0139867 A1 | 5/2022 | Uzoh | |
| 2022/0139869 A1 | 5/2022 | Gao et al. | |
| 2022/0208650 A1 | 6/2022 | Gao et al. | |
| 2022/0208702 A1 | 6/2022 | Uzoh | |
| 2022/0208723 A1 | 6/2022 | Katkar et al. | |
| 2022/0246497 A1 | 8/2022 | Fountain, Jr. et al. | |
| 2022/0285303 A1 | 9/2022 | Mirkarimi et al. | |
| 2022/0319901 A1 | 10/2022 | Suwito et al. | |
| 2022/0320035 A1 | 10/2022 | Uzoh et al. | |
| 2022/0320036 A1 | 10/2022 | Gao et al. | |
| 2022/0367302 A1 | 11/2022 | Katkar et al. | |
| 2022/0415734 A1 | 12/2022 | Katkar et al. | |
| 2023/0005850 A1 | 1/2023 | Fountain, Jr. | |
| 2023/0019869 A1 | 1/2023 | Mirkarimi et al. | |
| 2023/0036441 A1 | 2/2023 | Haba et al. | |
| 2023/0067677 A1 | 3/2023 | Lee et al. | |
| 2023/0069183 A1 | 3/2023 | Haba | |
| 2023/0100032 A1 | 3/2023 | Haba et al. | |
| 2023/0115122 A1 | 4/2023 | Uzoh et al. | |
| 2023/0122531 A1 | 4/2023 | Uzoh | |
| 2023/0123423 A1 | 4/2023 | Gao et al. | |
| 2023/0125395 A1 | 4/2023 | Gao et al. | |
| 2023/0130259 A1 | 4/2023 | Haba et al. | |
| 2023/0132632 A1 | 5/2023 | Katkar et al. | |
| 2023/0140107 A1 | 5/2023 | Uzoh et al. | |
| 2023/0142680 A1 | 5/2023 | Guevara et al. | |
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0187412 A1 | 6/2023 | Gao et al. | |
| 2023/0197453 A1 | 6/2023 | Fountain, Jr. et al. | |
| 2023/0197496 A1 | 6/2023 | Theil | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0299029 A1 | 9/2023 | Theil et al. | |
| 2023/0343734 A1 | 10/2023 | Uzoh et al. | |
| 2023/0360950 A1 | 11/2023 | Gao | |
| 2023/0361072 A1 | 11/2023 | Wang et al. | |
| 2023/0361074 A1 | 11/2023 | Uzoh et al. | |
| 2023/0369136 A1 | 11/2023 | Uzoh et al. | |
| 2023/0375613 A1 | 11/2023 | Haba et al. | |
| 2023/0420313 A1 | 12/2023 | Katkar et al. | |
| 2024/0038702 A1 | 2/2024 | Uzoh | |
| 2024/0055407 A1 | 2/2024 | Workman et al. | |
| 2024/0079376 A1 | 3/2024 | Suwito et al. | |
| 2024/0105674 A1 | 3/2024 | Uzoh et al. | |
| 2024/0120245 A1 | 4/2024 | Katkar et al. | |
| 2024/0162102 A1 | 5/2024 | Katkar et al. | |
| 2024/0170411 A1 | 5/2024 | Chang et al. | |
| 2024/0186248 A1 | 6/2024 | Haba et al. | |
| 2024/0186268 A1 | 6/2024 | Uzoh et al. | |
| 2024/0186269 A1 | 6/2024 | Haba | |
| 2024/0203917 A1 | 6/2024 | Katkar et al. | |
| 2024/0213191 A1 | 6/2024 | Theil et al. | |
| 2024/0213210 A1 | 6/2024 | Haba et al. | |
| 2024/0217210 A1 | 7/2024 | Zhao et al. | |
| 2024/0222239 A1 | 7/2024 | Gao et al. | |
| 2024/0222315 A1 | 7/2024 | Uzoh | |
| 2024/0222319 A1 | 7/2024 | Gao et al. | |
| 2024/0249985 A1 | 7/2024 | Katkar et al. | |
| 2024/0266255 A1 | 8/2024 | Haba et al. | |
| 2024/0298454 A1 | 9/2024 | Haba | |
| 2024/0304593 A1 | 9/2024 | Uzoh | |
| 2024/0312951 A1 | 9/2024 | Theil et al. | |
| 2024/0332184 A1 | 10/2024 | Katkar et al. | |
| 2024/0332227 A1 | 10/2024 | Uzoh et al. | |
| 2024/0332231 A1 | 10/2024 | Uzoh | |
| 2024/0332267 A1 | 10/2024 | Haba et al. | |
| 2024/0387419 A1 | 11/2024 | Mrozek et al. | |
| 2025/0343086 A1 | 11/2025 | Katkar et al. | |
| 2025/0349773 A1 | 11/2025 | Katkar et al. | |

FOREIGN PATENT DOCUMENTS

| | | | |
|---|---|---|---|
| CN | 109390305 A | 2/2019 | |
| CN | 110606465 A | 12/2019 | |
| EP | 2813465 A1 | 12/2014 | |
| JP | H10-112517 | 4/1998 | |
| JP | 2000-100679 | 4/2000 | |
| JP | 2001-102479 | 4/2001 | |
| JP | 2001-148436 | 5/2001 | |

(56)　　　　　References Cited

FOREIGN PATENT DOCUMENTS

| JP | 2002-353416 | | 12/2002 |
|---|---|---|---|
| JP | 2008-130915 | | 6/2008 |
| JP | 2009-014469 | A | 1/2009 |
| JP | 2009-039843 | | 2/2009 |
| JP | 2009-238905 | | 10/2009 |
| JP | 2010-199608 | | 9/2010 |
| JP | 2011-054637 | A | 3/2011 |
| JP | 2011-131309 | | 7/2011 |
| JP | 2011-243363 | A | 12/2011 |
| JP | 2012204443 | A | 10/2012 |
| JP | 2013-33786 | | 2/2013 |
| JP | 2013-513227 | | 4/2013 |
| JP | 2013-243333 | | 12/2013 |
| JP | 2014-219321 | | 11/2014 |
| JP | 2015-100886 | | 6/2015 |
| JP | 2015-153791 | | 8/2015 |
| JP | 2016-099224 | | 5/2016 |
| JP | 2018-160519 | | 10/2018 |
| KR | 10-2005-0101324 | | 10/2005 |
| KR | 10-2015-0097798 | | 8/2015 |
| KR | 10-2017-0108143 | | 9/2017 |
| TW | 200625582 | A | 7/2006 |
| TW | 201210098 | A1 | 3/2012 |
| TW | 201423876 | A | 6/2014 |
| TW | 201501259 | A | 1/2015 |
| TW | 201513216 | A | 4/2015 |
| TW | 201517175 | A | 5/2015 |
| TW | 201519379 | A | 5/2015 |
| TW | I533399 | B | 5/2016 |
| TW | 201618922 | A | 6/2016 |
| TW | 202107636 | A | 2/2021 |
| WO | WO 2005/043584 | A2 | 5/2005 |
| WO | WO 2006/100444 | A1 | 9/2006 |
| WO | WO 2007/103224 | A2 | 9/2007 |
| WO | WO 2012/130730 | A1 | 10/2012 |
| WO | WO 2014-074403 | A1 | 5/2014 |
| WO | WO 2017/100256 | A1 | 6/2017 |
| WO | WO 2017/151442 | A1 | 9/2017 |

OTHER PUBLICATIONS

Amirfeiz et al., "Formation of silicon structures by plasma-activated wafer bonding," Journal of The Electrochemical Society, 2000, vol. 147, No. 7, pp. 2693-2698.

Beer et al., "Coplanar 122GHz Antenna Array With Air Cavity Reflector for Integration in Plastic Packages", IEEE Antennas and Wireless Propagation Letters, 11:160-163, Jan. 2012.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Daneman, "Applying the CMOS Test Flow to MEMS Manufacturing", InvenSense, Inc., accessed on Apr. 5, 2020.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Gu et al., "A Multilayer Organic Package with 64 Dual-Polarized Antennas for 28GHz 5G Communication", IBM Research, pp. 1-3, 2017.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

Inertial MEMS Manufacturing Trends 2014 Report by Yole Developpement Sample Report, Slide 11, https://www.slideshare.net/Yole_Developpement/yole-inertial-memsmanufacturingtrends2014sample.

International Search Report and Written Opinion mailed Apr. 13, 2018 in International Application No. PCT/US2017/067742, 14 pages.

International Search Report and Written Opinion mailed Apr. 16, 2018 in International Application No. PCT/US2017/067741, 17 pages.

International Search Report and Written Opinion mailed May 31, 2018 in International Application No. PCT/US2018/022688, 2 pages.

International Search Report and Written Opinion mailed Mar. 7, 2019, in International Application No. PCT/US2018/060044, 14 pages.

International Search Report and Written Opinion mailed Apr. 22, 2019 in International Application No. PCT/US2018/064982, 13 pages.

International Search Report and Written Opinion mailed Aug. 26, 2019 in International Application No. PCT/US2019/031113, 14 pages.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—CU, Cu—Si, and Cu—SiO2 at low temperature," Proceedings—Electrochemical Society, 2003, vol. 19, pp. 239-247.

(56)　　　　　References Cited

OTHER PUBLICATIONS

Matsuzawa et al., "Room-temperature interconnection of electro-plated Au microbump by means of surface activated bonding method," Electornic Components and Technology Confererence, 2001, 51st Proceedings, IEEE, pp. 384-387.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Norton, Francis, "Permeation of gases through solids," Journal of Applied Physics, Jan. 1957, vol. 28, No. 1.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1(l), 6 pages.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

Plobi, A. et al., "Wafer direct bonding: tailoring adhesion between brittle materials," Materials Science and Engineering Review Journal, 1999, R25, 88 pages.

Reiche et al., "The effect of a plasma pretreatment on the Si/Si bonding behaviouir," Electrochemical Society Proceedings, 1998, vol. 97-36, pp. 437-444.

Roberds et al., "Low temperature , in situ, plasma activated wafer bonding," Electrochecmical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CMP-Cu film for bumpless interconnection," Electronic Components and Technology Confererence, 51st Proceedings, 2001, IEEE, pp. 755-760.

Shingo et al., "Design and fabrication of an electrostatically actu-ated MEMS probe card," Tranducers, Solid-State Sensors, Actua-tors and Microsystems, 12th International Conference, Jun. 8-12, 2003, vol. 2, pp. 1522-1525.

Suga et al., "A new approach to Cu—Cu direct bump bonding," IEMT/IMC Symposium, 1997, Joint International Electronic Manu-facturing Symposium and the International Microelectronics Con-ference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semicon-ductor Wafer Bonding: Science, Technology and Applications, The Electrochemical Society Proceedings, vol. 93-29 (1993), pp. 71-80.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Tech-nology Conference, 2002, IEEE, pp. 105-111.

Suga, "UHV room temperature joining by the surface activated bonding method," Advances in science and technology, Techna, Faenza, Italie, 1999, pp. C1079-C1089.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Con-ference, vol. 1, pp. 657-660.

Takagi et al., "Room-temperature bonding of lithium niobate and silicon wafers by argon-beam surface activation," Appl. Phys. Lett., 1999. vol. 74, pp. 2387.

Takagi et al., "Room temperature silicon wafer direct bonding in vacuum by Ar beam irradiation," Micro Electro Mehcanical Sys-tems, MEMS '97 Proceedings, 1997, IEEE, pp. 191-196.

Takagi et al., "Room-temperature wafer bonding of Si to LiNbO3, LiTaO3 and Gd3Ga5012 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Inte-grated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al, "Wafer-scale room-temperature bonding between sili-con and ceramic wafers by means of argon-beam surface activa-tion," Micro Electro Mechanical Systems, 2001, MEMS 2001, The 14th IEEE International Conference, Jan. 25, 2001, IEEE, pp. 60-63.

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Com-ponents and Technology Conference, 2004 IEEE, pp. 931-938.

Wang et al., "Reliability and microstructure of Au—Al and Au—Cu direct bonding fabricated by the Surface Activated Bonding," Elec-tronic Components and Technology Conference, 2002, IEEE, pp. 915-919.

Wang et al., "Reliability of Au bump—Cu direct interconnections fabricated by means of surface activated bonding method," Micro-electronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Zhang et al., "Antenna-on-Chip and Antenna-in-Package Solutions to Highly Integrated Millimeter-Wave Devices for Wireless Com-munications", IEEE Transactions on Antennas and Propagation, 57(10):2830-2841, Oct. 2009.

Zhou et al., "A Wideband Circularly Polarized Patch Antenna for 60 GHz Wireless Communications", Wireless Engineering and Tech-nology, 3:97-105, 2012.

Zoschke, K. et al., "Hermetic wafer level packaging of MEMS components using through silicon via and wafer to wafer bonding technologies," 2013 Electronic Components & Technology Confer-ence, 2013 IEEE, pp. 1500-1507.

"The Advantages of Integrated MEMS to Enable the Internet of Moving Things", mCube, White Paper Jan. 2018.

Ceramic Microstructures: Control at the Atomic Level, Recent Progress in Surface Activated Bonding, 1998, pp. 385-389.

Android Wiki, "Samsung Galaxy S2," indicating that the Samsung Galaxy S2 was unveiled on Feb. 13, 2011 at the Mobile World Congress (MWC) in Barcelona, https://android.fandom.com/wiki/Samsung_Galaxy_S2 (downloaded Nov. 20, 2023).

Bush, Steve, "Electronica: Automotive power modules from On Semi," ElectronicsWeekly.com, indicating an Onsemi AR0820 prod-

(56) References Cited

OTHER PUBLICATIONS uct was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Gadgets360, "Sony Xperia S," indicating that the Sony Xperia LT26i product was released on Feb. 12, 2012, https://www.gadgets360.com/sony-xperia-s-609 (downloaded Nov. 20, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

OmniVision OV20880 image, cross section of Omnivision product labeled OV20880, showing a hybrid bonded back side illuminated CMOS image sensor device with a pad opening to expose an aluminum bond pad. The part in the image was received on Sep. 24, 2021. Applicant makes no representation that the part in the image is identical to the part identified in the separately submitted reference Omnivision Technologies, Inc. in PR Newswire ("PR Newswire article"); however the imaged part and the part shown in the PR Newsire article share the part name "OV20880."

OmniVision Technologies, Inc., "OmniVision Announces New Family of 20-Megapixel PureCel®Plus-S Sensors for High-End Smartphones," PR Newswire, https://www.prnewswire.com/news-releases/omnivision-announces-new-family-of-20-megapixel-purecelplus-s-sensors-for-high-end-smartphones-300358733.html (dated Nov. 7, 2016; downloaded Nov. 20, 2023).

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820."

Samsung S5K3H2YX03 image, cross section of a back side illuminated CMOS image sensor (CIS) product, taken from Samsung Galaxy S2 phone. The part in the image was shipped on Nov. 25, 2011. The cross section shows tungsten and aluminum lining a trench formed in the back side of the sensor connecting a wire bond with a contact in the image sensor. The second image is a top-down view showing the wire bond pad and the trench that are depicted in the cross section. Applicant makes no representation that the part in the images is identical to image sensor products in the Galaxy S2 product identified in the separately submitted Android Wiki reference https://android.fandom.com/wiki/Samsung_Galaxy_S2 ("Android Wiki article"); however, the imaged sensor was obtained from a product named "Galaxy S2."

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes No. representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

Sony Xperia LT26i Sensor image, cross-section of a front side illuminated CMOS image sensor obtained from a Sony Xperia LT26i phone. The part in the image was received on Mar. 29, 2012. The cross section shows a metal line connecting a solder bump at the back side to a contact at the front side of the sensor, with non-conductive epoxy covering the metal. The second image is a bottom-up view of the image sensor. The third image is a bottom-up closeup view showing the edge of the sensor, with the solder bumps and metal line of the cross-section visible. Applicant makes No. representation that the part in the images is identical to image sensor products in the Sony Xperia LT26i product identified in the separately submitted Gadgets360 reference https://www.gadgets360.com/sony-xperia-s-609 ("Gadgets360 article"); however, the imaged sensor was obtained from a product named "Sony Xperia LT26i."

Gondcharton et al., "Voiding phenomena in copper-copper bonded structures: Role of creep." ECS Journal of Solid State Science and Technology. Jan. 8, 2015;4(3):P77-P82.

Insights From the Leading Edge. "Cu—Cu direct bonding." IFTLE 91 IEEE 3DIC Japan Feb. 2012; part 2, 5 pages.

* cited by examiner

CAVITY PACKAGES

CROSS-REFERENCE TO RELATED APPLICATIONS

This application is a continuation of U.S. patent application Ser. No. 17/146,304, filed on Jan. 11, 2021, titled "CAVITY PACKAGES", which is a divisional application of U.S. patent application Ser. No. 16/212,471, filed Dec. 6, 2018, titled "CAVITY PACKAGES," now U.S. Pat. No. 10,923,408, which claims priority to U.S. Provisional Patent Application No. 62/609,682, filed Dec. 22, 2017, titled "CAVITY PACKAGES," the entire disclosures of which are hereby incorporated herein by reference.

BACKGROUND

Field

The field generally relates to integrated device packages having cavities, and in particular, to radio frequency (RF) packages having air cavities.

Description of the Related Art

High performance radio frequency (RF) devices are in high demand today. The performance of an RF device can refer to its gain, bandwidth, directivity, etc. However, it can be difficult to manufacture high performance RF devices due to challenges associated with incorporating cavities in the device and providing precise dimensions for the cavity. Accordingly, there remains a continuing need for improved RF devices.

DETAILED DESCRIPTION

Figure 1A:
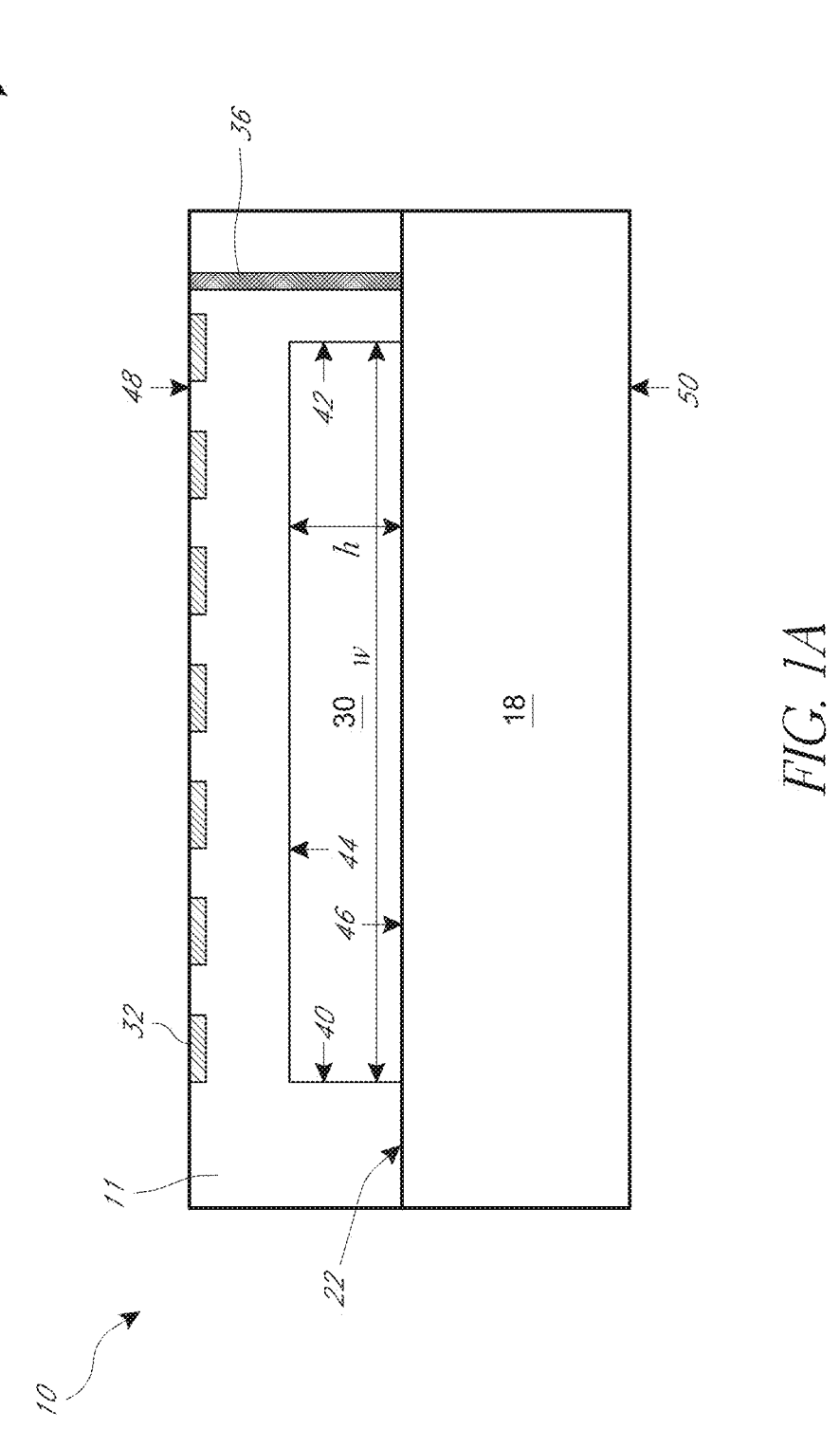
FIG. 1A is a schematic cross sectional view of an integrated device package that includes an element that comprises a frame and an antenna structure disposed on or near a top surface of the element, and a device die that is in electrical connection with the antenna structure via an interconnect.

In various technologies such as wireless communications technologies, communication frequency has been increasing and likely will continue to increase. For example, in a typical cellular network, frequencies can be on the order of at least a few GHz. With new standards (e.g., a 5G standard), frequencies can be substantially higher, for example, at least 25 GHz, at least 50 GHz, at least 75 GHz, etc. Different antenna structures can be more suitable for these new technologies with higher frequencies. An important objective in designing new antenna structures is to create a more efficient structure that consumes less energy, e.g., an antenna structure with higher gain is desirable. In addition, another important object in modern antenna design is to create a more efficient planar antenna structure that can operate over wider frequency range, as the planar antenna such as patch antenna has inherently smaller bandwidth compared to other types of antenna. In providing higher gain and/or wider bandwidth antennas, antenna structures with cavities that provide a resonance structure can be useful. However, as the frequencies increase, the cavity is typically smaller and may utilize more accurate and/or precise dimensions. Accordingly, there is a demand for improved structures for antenna packages.

Various embodiments disclosed herein relate to integrated device packages, for example, radio frequency (RF) packages that include cavities. In some embodiments, the integrated device packages can comprise device dies that are stacked to define the cavities. For example, in some embodiments, an RF package can comprise an antenna structure coupled to or formed with an element (e.g., a semiconductor element), a device die, and a cavity between the antenna structure and the device die. For example, in some embodiments, the semiconductor element can comprise the cavity and the device die can comprise an active die that is in electrical connection with the antenna structure, e.g., via a vertical interconnect.

The RF performance can be improved by including a cavity in an antenna package of the RF device, in some embodiments. In particular, a relatively small, precisely dimensioned cavity in the antenna package can be useful for improving, for example, the bandwidth of such devices especially with high frequency antennas. Also, reducing a horizontal dimension of the antenna package can allow the RF device to adapt for higher frequency applications. Further precise horizontal and/or vertical dimensions can be important in improving the performance of the RF device by, for example, allowing more narrowband applications with higher gains, or enabling more wider bandwidth applications with acceptable gains. Compact vertical interconnects to connect the antenna structure and an active die. The element and antenna structure can be stacked on the device die to reduce the horizontal dimension of the antenna package. However, manufacturing a precisely dimensioned cavity, and stacking the element with the antenna and the active die can be challenging.

FIG. 1A is a schematic cross sectional view of the integrated device package 1 that includes an element 10 that comprises a frame 11, an antenna structure 32, and a device die 18 that is in electrical connection with the antenna structure 32 via an interconnect 36. For example, in some embodiments, the antenna structure 32 can electrically connect to the interconnect 36 by way of conductive traces (not shown) disposed in or on the element 10. The device package 1 comprises a cavity between the element 10 and the device die 18.

In some embodiments, the frame 11 of the element 10 can comprise a semiconductor material or other dielectric material (e.g., silicon, GaAs, glass, etc.). In some embodiments, interconnect 36 (e.g., through silicon via (TSV), or through glass via (TGV), etc.) can be formed in the frame 11 by making a hole in the frame and disposing an electrically conductive material (e.g., copper, gold, etc.) in the hole. It may be beneficial to have the interconnect 36 in the frame 11, in some embodiments, in order to reduce the overall size of the integrated device package 1 as opposed to having electrical connections separate from the frame 11 and/or flip chip or wire bond interconnects. Also, such embodiments can allow for shorter distances between the device die 18 and the antenna structure 32 than with external electrical connections, which may increase signal transfer accuracy, and/or reduce electrical load in transferring signals from the device die 18 to the antenna structure 32 and vice versa. In some embodiments, the frame may include more than one interconnect 36. The interconnect 36 illustrated in FIG. 1A is illustrated as being disposed within the frame 11. However, the interconnect 36 may be formed at any location of the element 10 including the edge and/or side wall of the element 10.

In some embodiments, it can be desirable to fill the cavity 30 with a cavity filler. The cavity filler can comprise a low loss dielectric constant or low loss tangent filler e.g., a filler having a loss tangent below around 0.0001. In some embodiments, the cavity filler can comprise a gas, such as an inert gas, air, nitrogen, etc. In some embodiments, it can be desirable to use a dry gas (e.g., an inert dry gas) because humidity may alter the loss tangent of certain gases. In some other embodiments, the cavity filler can comprise a dielectric material. In some embodiments the cavity filler may comprise any combination of such filling materials or gases. The cavity filler (e.g., filling materials or gases) may be disposed in the cavity 30 in any suitable manner. It should be understood that the dimensions of the cavity 30 for a certain application can be determined at least in part by the properties of the cavity filler. It can also be beneficial to have the cavity filler with a known loss tangent in the cavity 30 for precise measurements.

In some embodiments, the cavity 30 can comprise coatings (not shown) on or at its inner periphery. For example, a first wall 40, a second wall 42, an upper surface 44 and/or an lower surface 46 can be coated with metal and/or an additional dielectric layer. In some embodiments, it can be important to provide a hermetically sealed cavity 30 to isolate the cavity 30 from outside environ to have a known gas or material in the cavity 30. The cavity may also provide mechanical support for the antenna structures 32, 34, in some embodiments.

Figure 5:
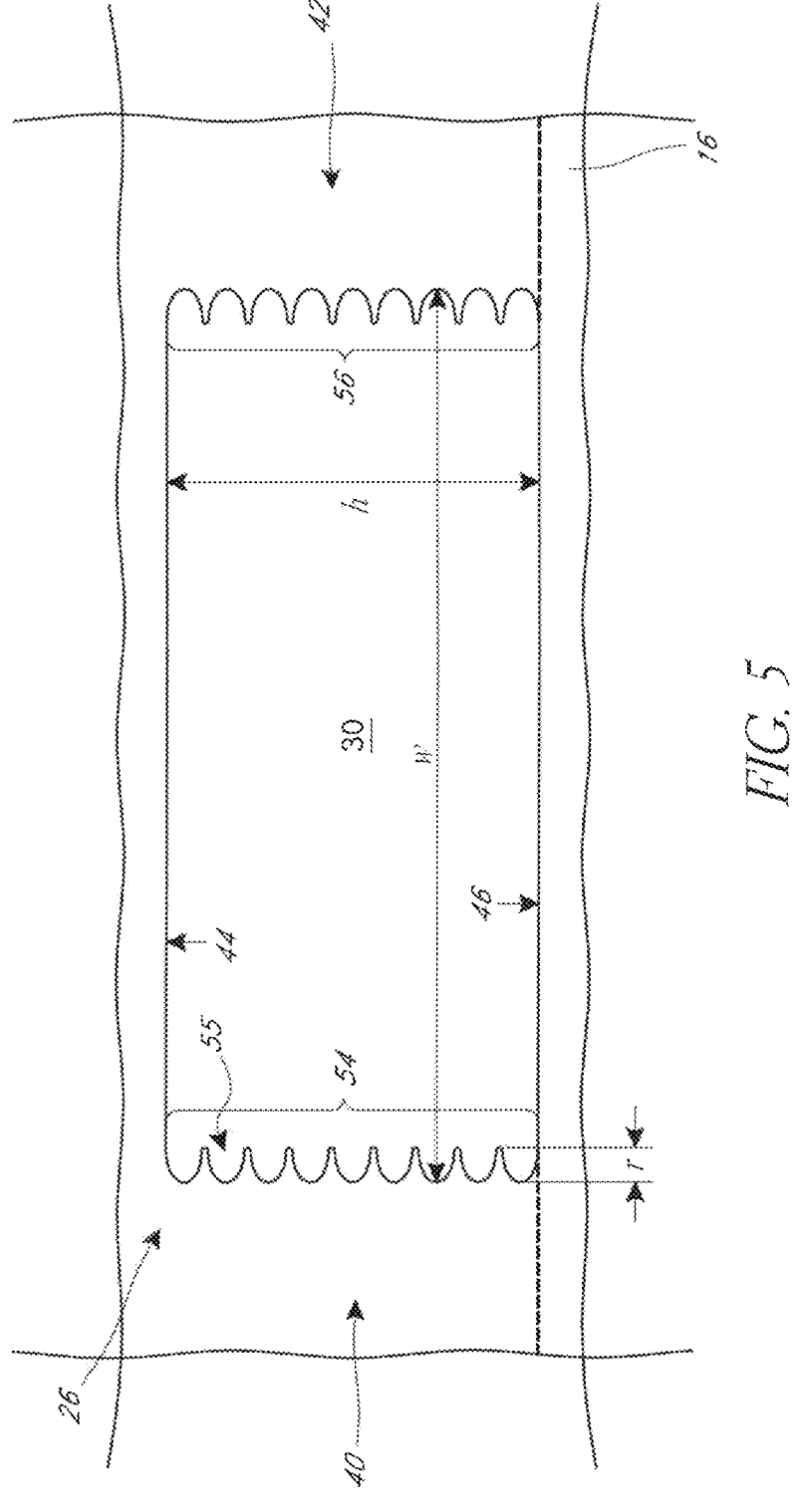
FIG. 5 is a schematic cross sectional zoomed in view of the integrated device package around the cavity showing exaggerated view of uneven and/or scalloped surfaces of the walls.

In some embodiments, the cavity can be defined by, for example, etching the frame 11 of the element 10 (See FIG. 5). In some embodiments, the cavity 30 can comprise the first wall 40 and the second wall 42. In such embodiments, the first wall 40 and the second wall 42 can comprise two opposing sides of the cavity 30. The cavity 30 can also comprise the upper surface 44 and the lower surface 46. In the illustrated embodiment of FIG. 1, a portion of the element 10 can comprise the upper surface 44 and a portion of the device die 18 can comprise the lower surface 46. Although, the cavity 30 illustrated in FIG. 1A has a rectangular shape as seen in the cross-sectional view, the cavity 30 may form any other suitable shape.

As illustrated in FIG. 1A, the antenna structure 32 can be disposed on or near a top surface 48 of the element 10. For example, the antenna structure 32 can be at least partially embedded in the frame 11. In some embodiments, the antenna structure 32 can be disposed on top of the frame 11, e.g., deposited on exterior surfaces of the frame 11. However, it should be understood that the antenna structure 32 may be disposed at a different location of the integrated package 1. (See, for example, FIG. 1B). For example, the antenna structure 32 may be disposed near the upper surface of the cavity 30, between the upper surface of the cavity 30 and the top surface of the element 10, near the lower surface 46 of the cavity 30, etc. As shown in FIG. 1A, the antenna structure 32 can comprise a plurality of laterally spaced antenna structure elements. In some embodiments, the antenna structure 32 can comprise a phased array antenna that can include array of antennas. Each of the antennas of the phased array antenna can be independently controlled. A signal that is phase shifted can be applied to each of the antennas of the phased array antenna and can provide for a constructive or destructive interference. Each of the antennas can correspond to the antenna structure elements that are spaced laterally. The spacing between the antenna structure elements can be optimized to provide a desired interference coupling. In some embodiments, the antenna structure 32 can comprise a patch antenna. The patch antenna can be configured to transmit and/or receive signals at different frequencies which may be individually routed. In some embodiments the device die 18 may comprise a splitter that may filter the bandwidth of interest for each split. Although there is only one antenna structure 32 illustrated in FIG. 1A, in some embodiments, the element 10 can comprise multiple antenna structures. In some embodiments, the multiple antenna structures may be disposed at different portions of the element 10.

The element 10 and the device die 18 can be directly bonded together at a bonding surface 22 without an intervening adhesive. Directly bonding the element 10 and the device die 18 can be beneficial, in some embodiments. For example, in some embodiments, directly bonding the element 10 and the device die 18 can provide a better sealing without increasing footprint or thickness of the package 1 than bonding using other methods of bonding, such as bonding using an adhesive. For example, because direct bonding does not include an underfill between the element 10 and the device die 18, leakage of the underfill is avoided. In other embodiments, however, the element 10 and the device die 18 can be bonded with an adhesive.

Preparation of the direct bonding surfaces can include provision of nonconductive layers such as silicon oxide. The bonding surfaces of the element 10 and the device die 18 can be polished to a very high degree of smoothness (e.g., less than 20 nm surface roughness, or more particularly, less than 1 nm surface roughness) e.g., by chemical mechanical polishing (CMP). In some embodiments, the surfaces to be bonded may be terminated with a suitable species and activated prior to bonding. For example, in some embodiments, the bonding surfaces of the bonding layer to be bonded, such as silicon oxide material, may be very slightly etched for activation and exposed to a nitrogen-containing solution and terminated with a nitrogen-containing species. As one example, the surfaces to be bonded may be exposed to an ammonia dip after a very slight etch, and/or a nitrogen-containing plasma (with or without a separate etch). Once the respective surfaces are prepared, the bonding surfaces (such as silicon oxide) of the element 10 and the device die 18 can be brought into contact. The interaction of the activated surfaces can cause the bonding surface of the first element 10 to directly bond with the bonding surface of the device die 18 without an intervening adhesive, without application of external pressure, without application of voltage, and at room temperature. In various embodiments, the bonding forces of the nonconductive regions can include covalent bonds that are greater than Van der Waals bonds and exert significant forces between the conductive features. Prior to any heat treatment, the bonding energy of the dielectric-dielectric surface can be in a range from 150-300 $mJ/m^2$, which can increase to 1500-4000 $mJ/m^2$ after a period of heat treatment. Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. Patent Application Publication Nos. 2017/0062366; 2016/0314346; 2017/0200711, the contents of each of which are hereby incorporated by reference herein in their entirety and for all purposes.

The cavity 30 can have a width w from the first wall 40 to the second wall 42. A dimension of the width w can depend on the frequency of electromagnetic signals used in a system that integrates the integrated package 1. For example, for a frequency of 24 GHz, the width w can be about 6 mm and for a frequency of 128 GHz, the width w can be about 1 mm, in some embodiments. In some embodiments, the frequency of the electromagnetic signals can be in a range of 24 GHz to 128 GHz. For example, the frequency can be in a range of 24 GHz to 75 GHz, in a range of 50 GHz to 128 GHz, in a range of 50 GHz to 75 GHz, etc. The width w can be in a range of 0.5 mm to 14 mm, in some embodiments. For example, the width w can be in a range of 0.5 mm to 5 mm, in a range of 4 mm to 14 mm, in a range of 4 mm to 5 mm, etc. The width w may have a tolerance due to, for example, uneven surfaces of the first and second walls 40, 42 that can have a roughness r (see FIG. 5) of 1 μm to 2 μm, in some embodiments. In some other embodiments, the roughness r can be, for example, in a range of 0.1 μm to 2 μm. The roughness r can be less than 0.1% of the width w, in some embodiments. The cavity 30 can have a height h from the lower surface 46 to the upper surface 44. In some embodiments, a dimension of the height h can depend on operation frequency (wavelength) and/or signal strength. The height h can be half of the wavelength of the operation frequency. Smaller height tends to have lower signal radiation strength. Hence, in some embodiments, the height h can be determined with the consideration of both height design limit and signal strength requirement, for example, a desired magnitude of the signals to be communicated. The height h can be in a range of 5 μm to 500 μm, in some embodiments.

For example, the height h can be in a range of 5 μm to 250 μm in a range of 50 μm to 250 μm, in a range of 150 μm to 500 μm, in a range of 150 μm to 250 μm, etc. The height h may have a roughness of less than 0.5 μm, in some embodiments. For example, the roughness can be less than 0.05 μm. The roughness can be less than about 0.2%, for example, less than 0.1% to 0.5% of the height h, in some embodiments. It should be understood that using semiconductor or dielectric materials (e.g., silicon, glass, etc.) for the frame can provide high accuracy in making recesses with such small dimensions. Beneficially, the embodiments disclosed herein can provide accurately dimensioned cavities for high frequency RF applications.

Figure 1B:
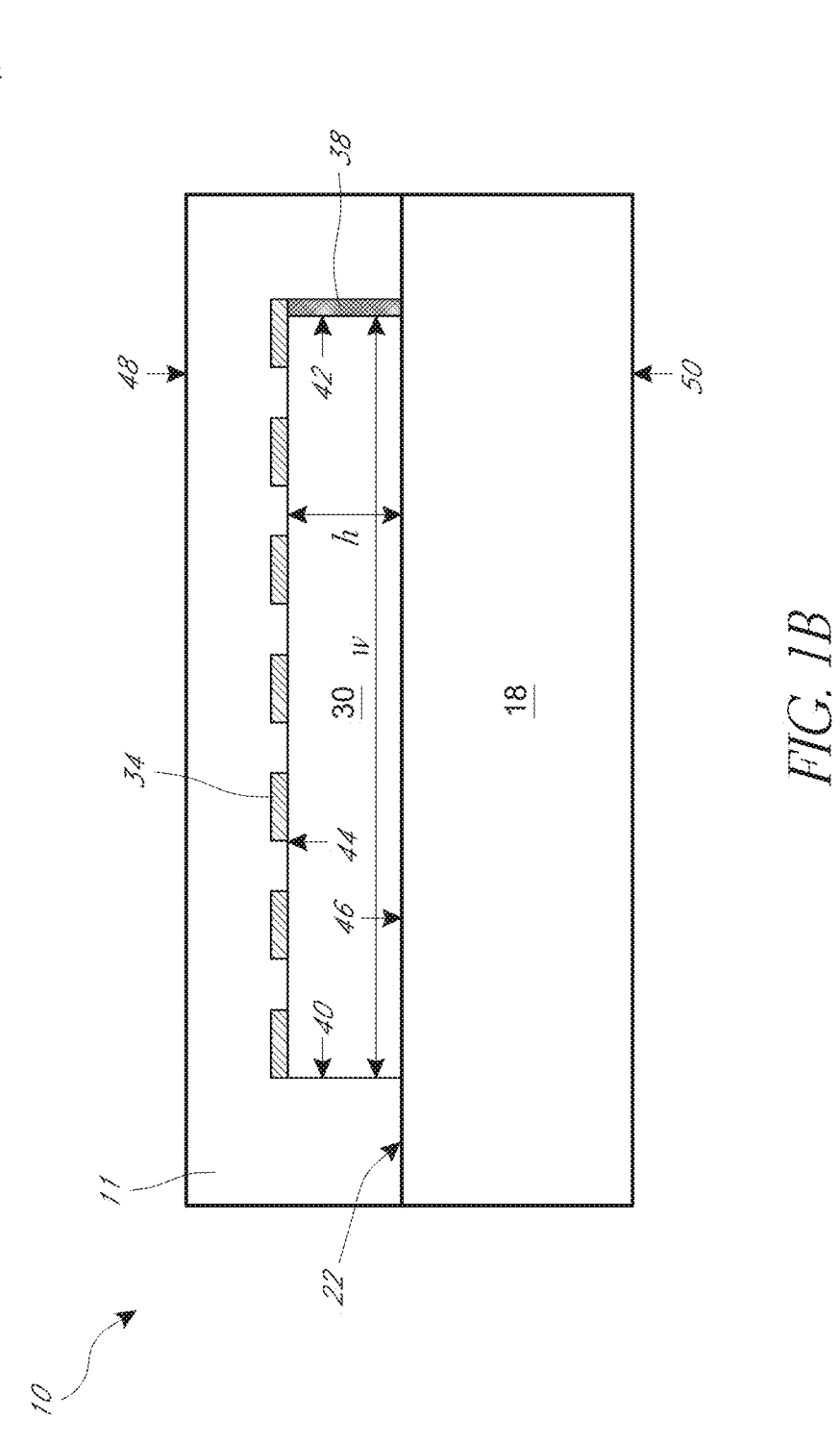
FIG. 1B is a schematic cross sectional view of the integrated device package with the antenna structure disposed on or near an upper surface of a cavity formed between the antenna structure and the device die.

FIG. 1B is a schematic cross sectional view of the integrated device package 1 that includes an element 10 that comprises a frame 11 and an antenna structure 34, and a device die 18 that is in electrical connection with the antenna structure 34 via an interconnect 38. Unless otherwise noted, the components of FIG. 1B may be the same as or generally similar to like-numbered components of FIG. 1A.

Unlike the embodiment of FIG. 1A, in FIG. 1B, the antenna structure 34 can be disposed on or near the upper surface 44 of the cavity 30. As with the antenna structure 32 illustrated in FIG. 1A, the antenna structure can be embedded in the frame 11 and/or disposed on top of the frame 11. Also, unlike the embodiment of FIG. 1A where the interconnect 36 extends from the device die 18 to the antenna structure 32 on or near the top surface 48 of the element 10, the interconnect 38 of FIG. 1B extends from the device die 18 to the antenna structure 34 on or near the upper surface 44 of the cavity 30. Further, the interconnect 38 illustrated in FIG. 1B is disposed along the second surface 42 of the cavity 30. There may be various benefits to having the antenna structure 32 on or near the top surface 48 of the element 10 as shown in FIG. 1A or having the antenna structure 34 on or near the upper surface 44 of the cavity 30 as shown in FIG. 1B. For example, forming the antenna structure 32 on the top surface 48 (FIG. 1A) may be easier and less expensive than forming the antenna structure 34 on the upper surface 44 of the cavity 30. However, providing the antenna structure 34 on the upper surface 44 of the cavity 30 can place the antenna structure 34 closer to the cavity 30 and/or the device die 18, providing improved performance. Although the antenna structure 34 is shown to be embedded within the material of the frame 11 near the upper surface 44 of the cavity 30, antenna structure 34 may also be deposited on top of the material of the frame 11 near the upper surface 44 of the cavity 30.

Although only one antenna and the location is shown in FIG. 1A and FIG. 1B, it is understood that element 10 may have one or more antenna structures 32 on or near the top surface 48 or one or may antenna structures 34 on the upper surface 44 of the cavity 30 or one or more antenna structures 32 and 34 simultaneously at both the locations.

A skilled artisan will understand that one element may include both the antenna structure 32 illustrated in FIG. 1A and the antenna structure 34 illustrated in FIG. 1B. In such embodiments, the element may also include the interconnects 36 and 38. In some other embodiments, the element may include more antenna structures at various portions of the element.

Figure 2:
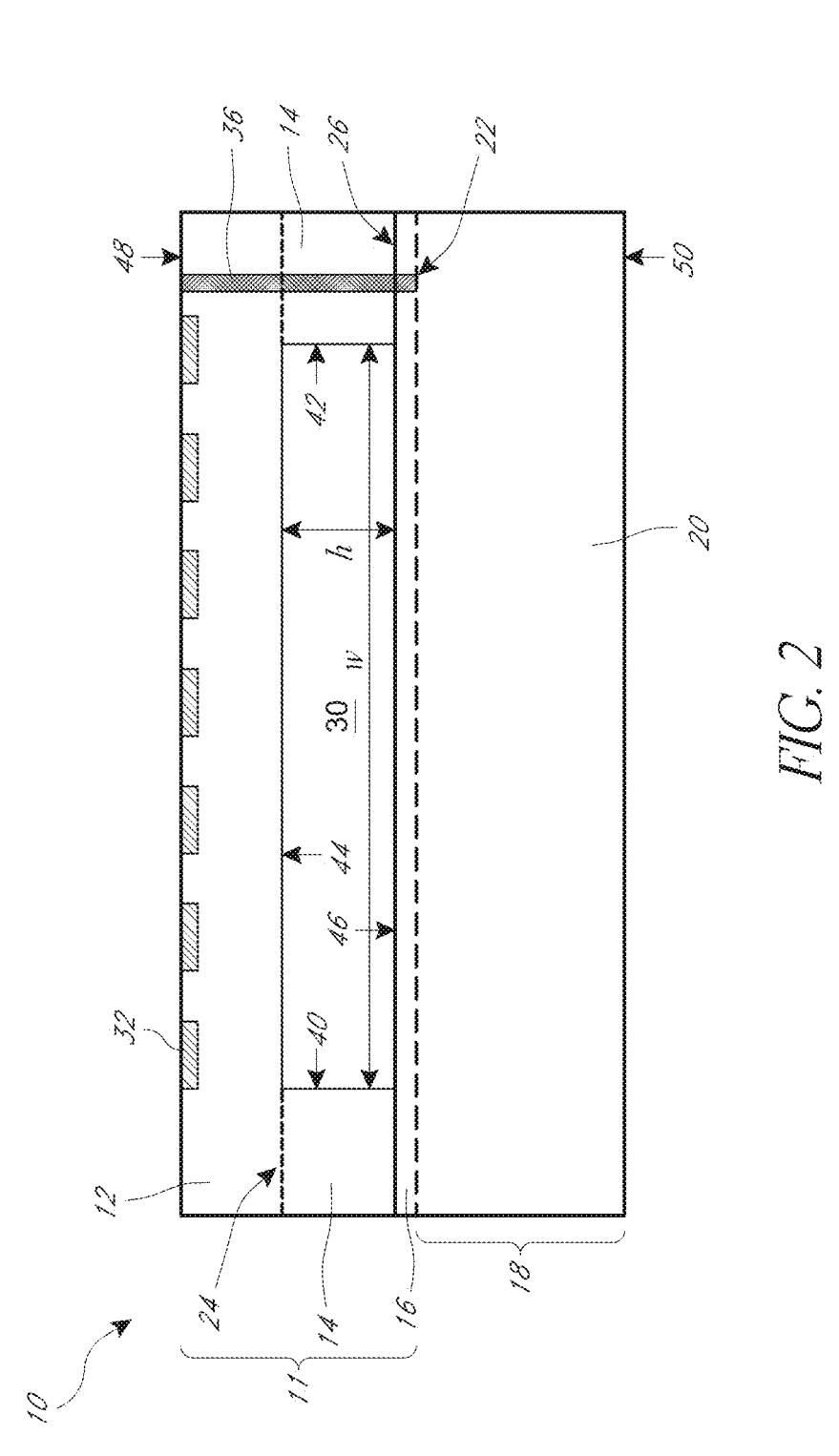
FIG. 2 is a schematic cross-sectional view of the integrated device package that shows the element comprising a plurality of frame portions bonded together.

FIG. 2 is a schematic cross-sectional view of the integrated device package 1 that shows the element 10 comprising a plurality of frame portions 12, 14, 16 bonded together at second and third bonding surfaces 24, 26. The integrated device package of FIG. 2 includes the antenna structure 32 disposed on or near the top surface 48. However, it should be understood that the integrated device package 1 of FIG. 2 can include the antenna structure on or near the upper surface 44 of the cavity 30 as illustrated in FIG. 1B or at any other suitable location. Unless otherwise noted, the components of FIG. 2 may be the same as or generally similar to like-numbered components of FIGS. 1A and 1B.

In some embodiments, the element 10 can comprise the frame 11 having a plurality of frame portions bonded together (e.g., directly bonded without an intervening adhesive). The frame 11 can comprise, for example, first, second, and third frame portions 12, 14, 16. As shown in FIG. 2, the first and second frame portions 12, 14 can be directly bonded at a second bonding surface 24, and the second and third frame portions 14, 16 can be directly bonded at a third bonding surface 26 to form the frame 11 for the element 10. Therefore, in such embodiments, sections of the first frame portion 12 can comprise the upper surface 44 of the cavity 30 and the top surface 48 of the element 10, sections of the second frame portion 14 can comprise the first and second walls 40, 42, and a section of the third frame portion 16 can comprise the lower surface 46 of the cavity 30. However, the third portion 16 may be omitted and a planar portion of the die 18 may comprise the lower surface 46 of the cavity 30, in some embodiments.

In some embodiments, when the first, second, and third frame portions 12, 14, 16 are bonded separately, the via 36 may not be a single homogenous via. For example, the via may comprise separate portions bonded at interfaces, such as the second and the third bonding surfaces 24, 26. In some embodiments, the portions of the via 36 in the respective frame portions 12, 14, 16 may be offset from one another. For example, the offset portions of the via 36 can be electrically connected by way of a redistribution layer.

In some embodiments, the first and second frame portions 12, 14 can comprise a unitary structure eliminating the second bonding interface 24. For example, the second frame portion 14 can extend from the first frame portion 12. In some embodiments, the unitary structure can be bonded to the third frame portion 16 at the third bonding surface 26. In some other embodiments, the unitary structure can be bonded to the device die 18 without the third frame portion 16.

In some embodiments, the second and third frame portions 14, 16 can comprise a unitary structure eliminating the third bonding interface 26. For example, the second frame portion 14 can extend from the third frame portion 16. In some embodiments, the unitary structure can be bonded together with the first frame portion 12 at the second bonding surface 24. I should be understood that, in some other embodiments, the third frame portion 16 illustrated as a portion of the frame 11 can be a portion of the integrated device die 18 separate from a first die portion 20. Similarly, the second frame portion 14 illustrated as a portion of the frame 11 can be a portion of the integrated device die 18.

Figure 3A:
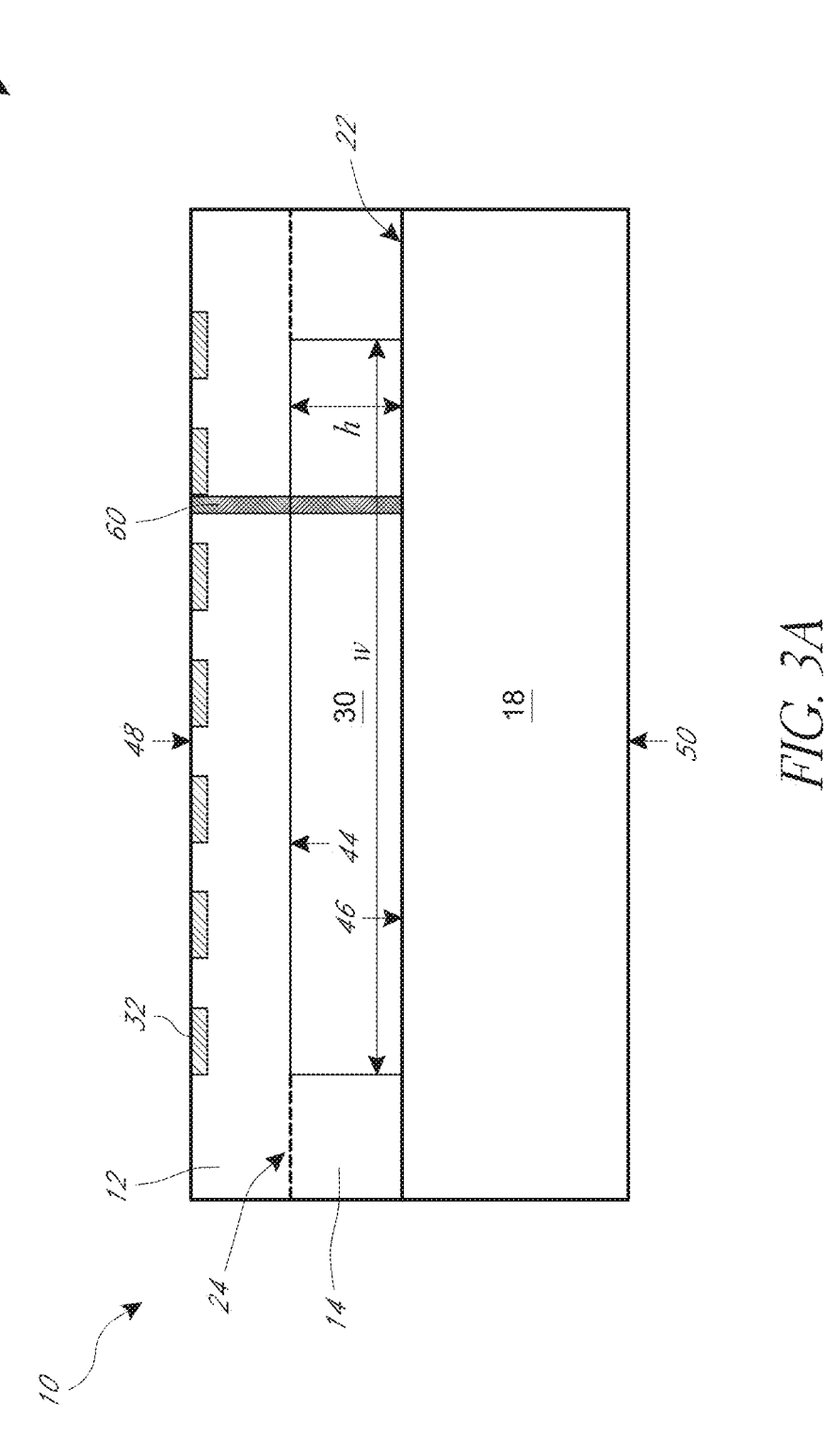
FIG. 3A is a schematic cross sectional view of the integrated device package that includes a first interconnect extending from the die to the antenna structure through the cavity.
Figure 3B:
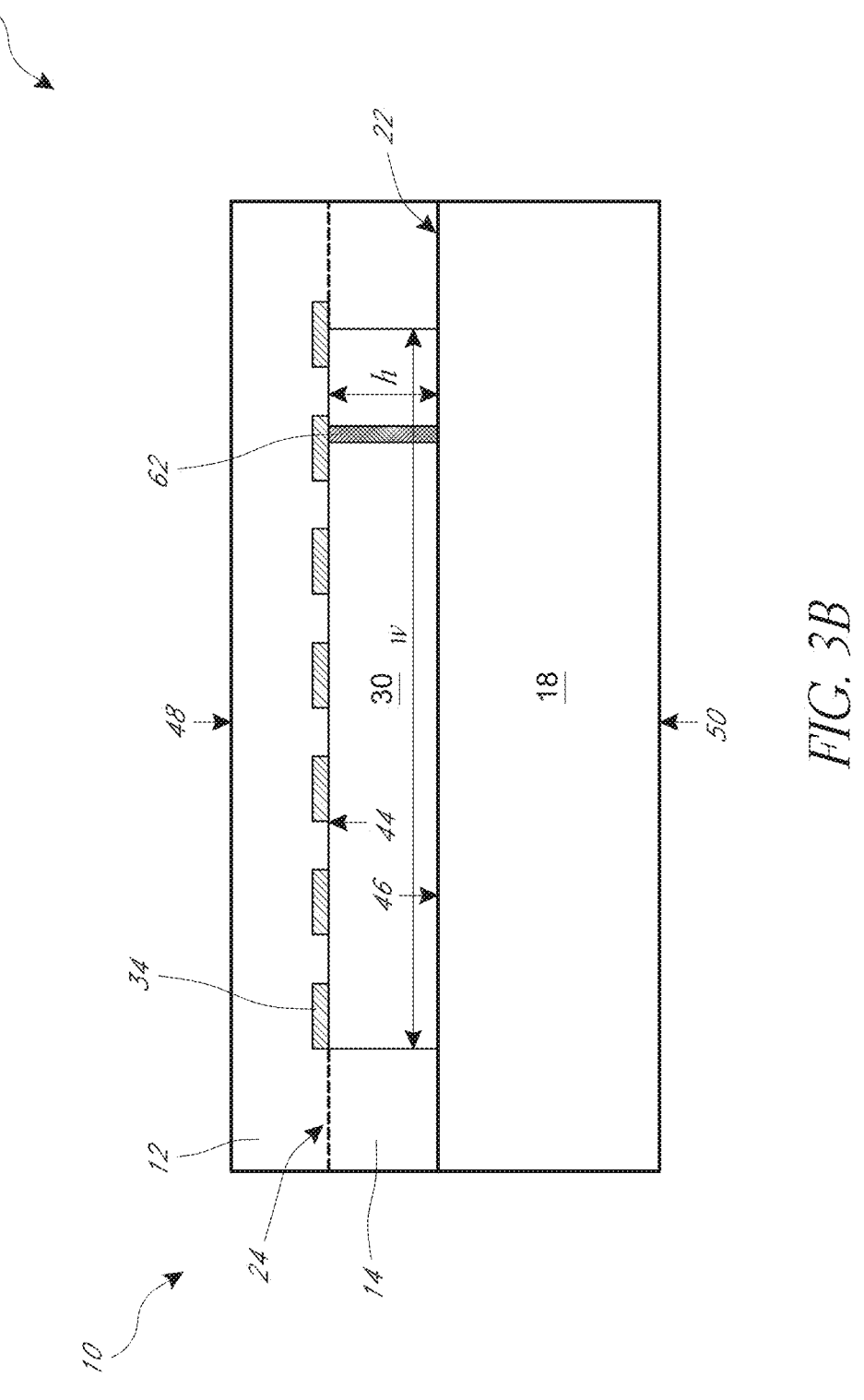
FIG. 3B is a schematic cross sectional view of the integrated device package that includes a second interconnect extending from the die to the antenna structure.

FIG. 3A is a schematic cross sectional view of the integrated device package 1 that includes a first interconnect 60 extending from the die 18 to the antenna structure 32 through the cavity 30. FIG. 3B is a schematic cross sectional view of the integrated device package 1 that includes a second interconnect 62 extending from the die 18 to the antenna structure 34. Unless otherwise noted, the components of FIGS. 3A and 3B may be the same as or generally similar to like-numbered components of FIGS. 1A, 1B and 2. In some embodiments the first and second interconnects 60, 62 can be connected to the antenna structures 32, 34, respectively, to electrically connect circuitry of the die 18 to the antenna structures 32, 34. In such embodiments, the interconnects 36, 38 of FIGS. 1A and 1B can be omitted. In the embodiment of FIG. 3A, the interconnect 60 can extend from the lower surface 46 of the cavity 30 (e.g., the upper surface of the die 18), through the cavity 30, and through a thickness of the frame portion 12 to connect to the antenna element 32. In the embodiment of FIG. 3B, the interconnect 62 can extend from the lower surface of the cavity 30 (e.g., the upper surface of the die 18), and through the cavity 30 to connect to the antenna element 32 at the upper surface 44 of the cavity 30.

Using the interconnects 60, 62 as the electrical interconnect instead of the interconnects 36, 38 can be beneficial in some embodiments. For example, using the interconnects 60, 62 can obviate the steps of etching through the frame to form the hole in which the conductive material is to be disposed. Thus, forming the interconnect 62 can be easier and/or faster than forming the interconnect 38. In addition, having the interconnect 60, 62 laterally within the cavity 30 may reduce an overall lateral dimension of the integrated device package 1. In some embodiments, the interconnect 62 can act as a resonator without being connected to the upper surface 44. In some embodiments, the interconnects 60, 62 can comprise posts that extends upwardly from the lower surface 46 of the cavity 30. In such embodiments, the interconnects 60, 62 can be formed by various processes. In some embodiments, the interconnects 60, 62 can be formed as a part of a same unitary structure as the cavity 30. For example, the interconnects 60, 62 can be formed during joining of the frame portions 12, 14. For example, in a solitary or unitary structure, the interconnects 60, 62 can be formed by forming a hole in a pre-cavity unitary piece of the frame, (e.g., by etching, drilling, etc.) and filling the hole with a conducive material. The hole can be filled with the conductive material by, for example, plating, or in any suitable way. The forming process may be followed by etching the cavity 30 around the interconnect 60, 62. In some other embodiments, a cavity is etched in the pre-cavity unitary piece of the frame, followed by the deposition of the antenna 34 on or near the upper surface 44 of the cavity 30, filling the cavity 30 with a resist, making a hole in the resist and filling the hole with a conducive material. The conductive material can be filled in the hole by, for example, plating or any other suitable way to form the interconnect 62 and removing the resist. A skilled artisan will understand that the interconnects 60 and 62 may have a short length for a thin cavity structure. In some embodiments, the thin cavity structure can have the height h in a range of, for example, 5 μm to 10 μm. For example in such thin cavity structure, the interconnect 62 can comprise a copper post formed on the device die 18.

Figure 4A:
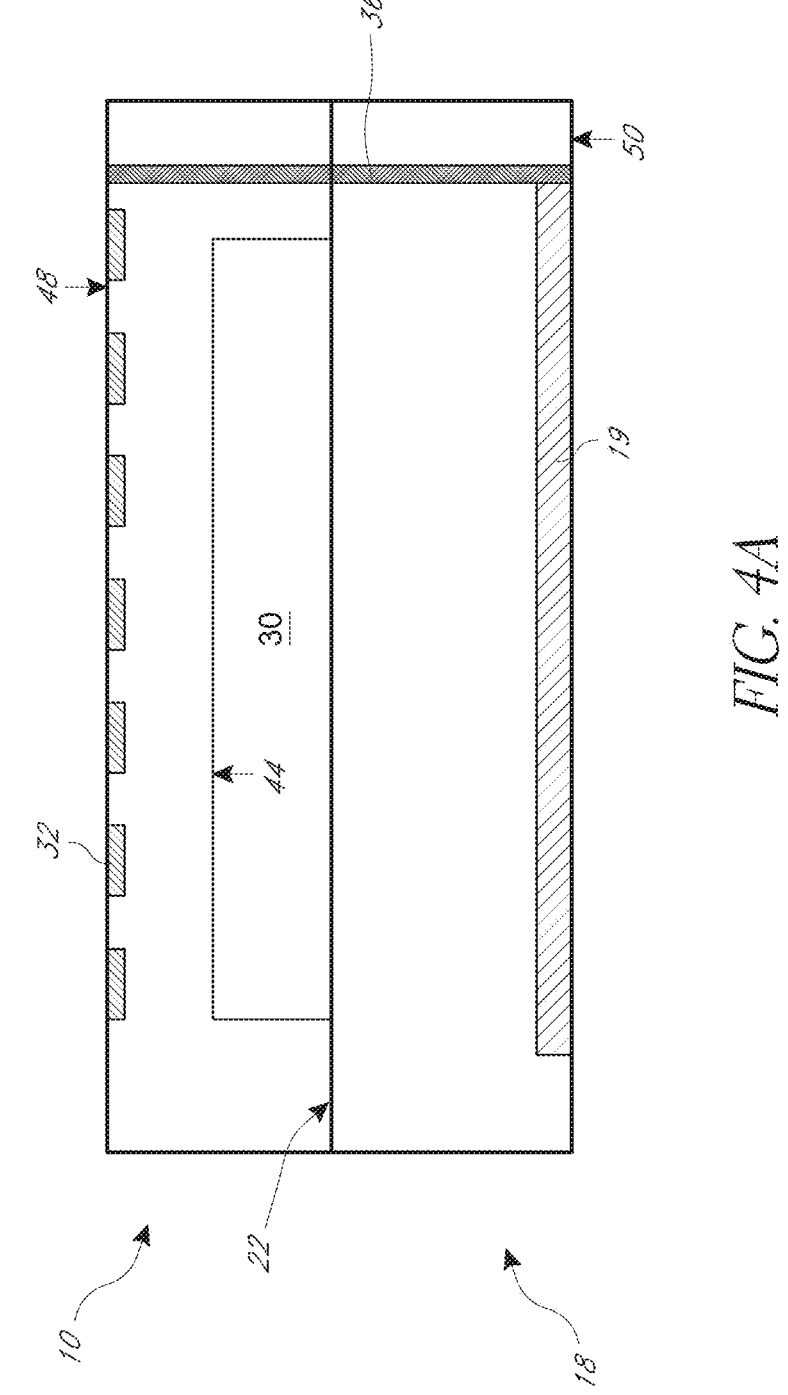
FIG. 4A is a schematic cross-sectional views of the integrated device package having an active circuitry near a bottom surface of the device die and the cavity in the element.
Figure 4B:
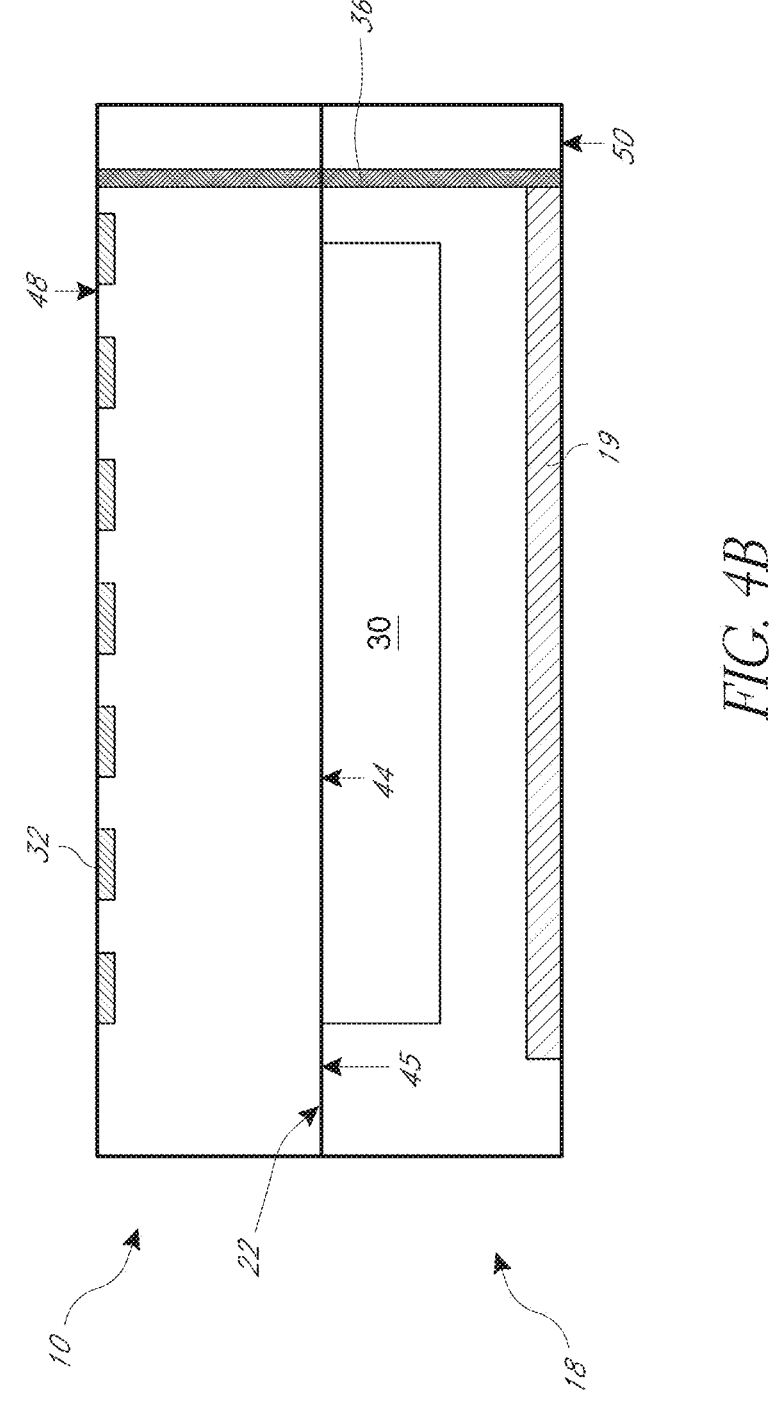
FIG. 4B a schematic cross-sectional views of the integrated device package having an active circuitry near a bottom surface of the device die and the cavity in the device die.

FIGS. 4A and 4B are schematic cross-sectional views of an integrated device package 1 having the cavity 30 in different portions of the integrated device package 1. Although the antenna structure 32 of FIGS. 4A and 4B is shown on or near the top surface 48, in other embodiments the antenna structure 34 can be provided on or near the upper surface 44, as disclosed in other embodiments, such as in FIG. 1B. Unless otherwise noted, the components of FIGS. 4A and 4B may be the same as or generally similar to like-numbered components of FIGS. 1A to 3B.

In the illustrated embodiments of FIGS. 1A to 4A, the cavity 30 is defined by a recess formed in the element 10 and a lower surface 46 which may be defined by, for example, etching the frame 11 of the element 10 and bonding the device die 18 to the element 10. However, as illustrated in FIG. 4B, in other embodiments, the cavity 30 can be defined by other portions of the integrated device package 1, for example, by a recess formed in the device die 18 and a portion of a planar portion 45 of the element 10, which defines the upper surface 44 of the cavity 30. In some other embodiments, the cavity 30 can be defined by recesses in both the element 10 and the device die 18.

In some embodiments, active circuitry 19 can be disposed at or near the bottom surface 50 of the device die 18, as illustrated in FIGS. 4A and 4B. In some embodiments, the active circuitry 19 can be electrically connected to the antenna structure 32 via the interconnect 36. However, it should be understood that the active circuitry 19 may be disposed anywhere in the device die 18 (e.g., near the bonding surface 22, or embedded within the die 18). Beneficially, in FIG. 4B, it may be easier to form the antenna structure at or near the upper surface 44 of the cavity than in other arrangements because the upper surface 44 is not recessed from the planar portion 45 of the element 10.

FIG. 5 is a schematic cross sectional zoomed in view of the integrated device package 1 around the cavity 30 showing exaggerated view of uneven and/or scalloped surfaces 54, 56 of the walls 40, 42. Unless otherwise noted, the components of FIG. 5 may be the same as or generally similar to like-numbered components of FIGS. 1A to 4B. As can be seen here, in some embodiments, the scalloped surfaces 54, 56 can comprise markings indicative of an etching process, e.g., deep reactive ion etching (DRIE). It can be desirable to have the roughness r of the scalloped surfaces 54, 56 below a certain level to provide better performance for the antenna structure. In theory, having perfectly flat surfaces for the inner periphery of the cavity can enable the formation of a standing wave. However, in practice, it can be challenging to provide surfaces that are perfectly flat. In some embodiments, for example, the etching process can etch from the lower surface 46 of the cavity 30. At each etching step a curved surface 55 (which can be small) is formed. After etching n times from the lower surface 46 to the upper surface 44, there can be n curved surfaces on the scalloped surfaces 54, 56. It should be understood that each curve can be unique and may have different roughness r from the other curved surfaces. As disclosed above, in some embodiments, the roughness r can be in a range of 0.1 $\mu$m to 2 $\mu$m and/or less than 0.1% of the width w. In some embodiments, to improve (e.g., smoothen) the roughness, a oxide layer (for example, a thin thermal oxide layer that is thicker than the roughness r or the scalloped surfaces) can be grown after the cavity 30 with the scalloped surfaces 54, 56 is formed by, for example, using the DRIE process. This oxide layer can be etched away to form a significantly smoother cavity side walls than without the use of the thermal oxide layer.

Figures 6A, 6B, 6C:
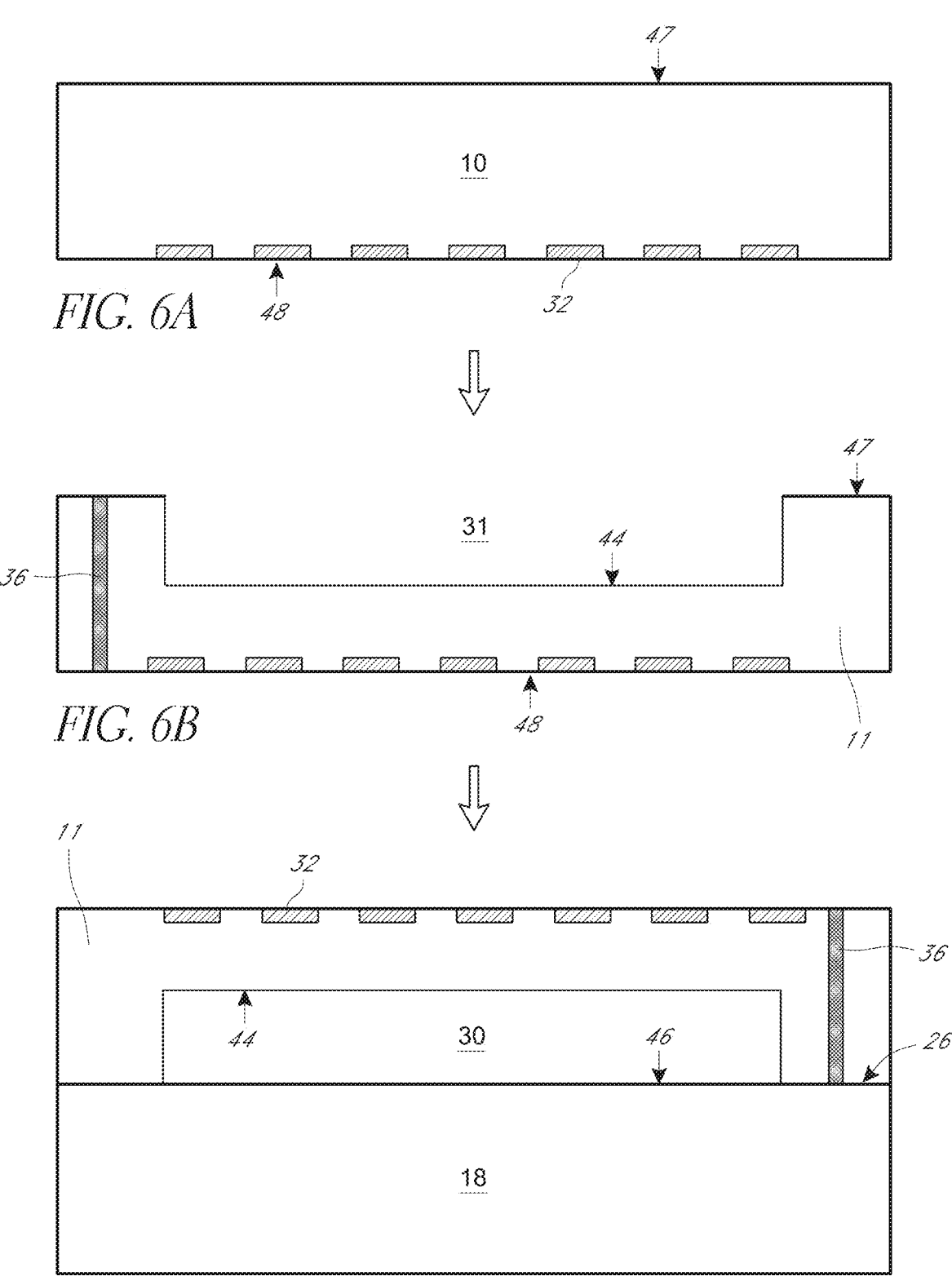
FIG. 6A is a cross sectional view of the element prior to making a recess for forming the cavity.
FIG. 6B is a cross sectional view of the element after making a recess for forming the cavity.
FIG. 6C is a cross sectional view of the integrated device package after bonding the element of FIG. 6B to the device die.

FIGS. 6A to 6C show steps of making the cavity 30 in the integrated device die 1. Unless otherwise noted, the components of FIGS. 6A to 6C may be the same as or generally similar to like-numbered components of FIGS. 1A to 5. In the illustrated embodiment, the antenna structure 32 is formed prior to bonding and forming the cavity 30. However, it should be understood that the antenna structure 32 can be formed after forming the cavity 30. In some embodiments, the element 10 that comprises the frame 11 and the antenna structure 32 can be provided, as shown in FIG. 6A. The frame 11 can have an etching surface 47 opposite the top surface 48. The frame can be etched from the etching surface 47 to form a recess 31 having the upper surface 44 (see FIG. 6B). At this step, the interconnect 36 can also be formed by making a hole by way of, for example etching or drilling, and disposing a conductive material (e.g., copper, gold, etc.)

in the hole, in some embodiments. However, the interconnect 36 may be formed, for example, prior to forming the cavity 31. In some embodiments, the interconnect 36 may be formed, for example, after bonding the element 10 with the device die 18. As shown in FIG. 6C, the element 10 can be flipped upside down and bonded (e.g., directly bonded without an intervening adhesive in some embodiments) to the device die 18 at the bonding surface 26, defining the cavity 30 with the recess 31 and the lower surface 46 of the cavity 30. It should be understood that the frame may comprise a plurality of frame portions as discussed above with respect to FIG. 2. The interconnect 36 can be electrically connected to one or more metal pads of the device die 18. In some embodiments, the electrical connection between the interconnect 36 and the one or more metal pads of the device die 18 may be formed by, for example, a hybrid bond and/or a direct bond when interconnect 36 is formed prior to bonding. In some other embodiments, the hole in frame 11 may be opened to be accessible to the one or more electrical pads on the top surface 46 of device 18, and the hole can be filled with a conductive material by, for example, electroplating etc. to form the interconnect 36 in via-last approach when the interconnect 36 is formed after bonding the frame 11 to the device die 18.

Figure 7A:
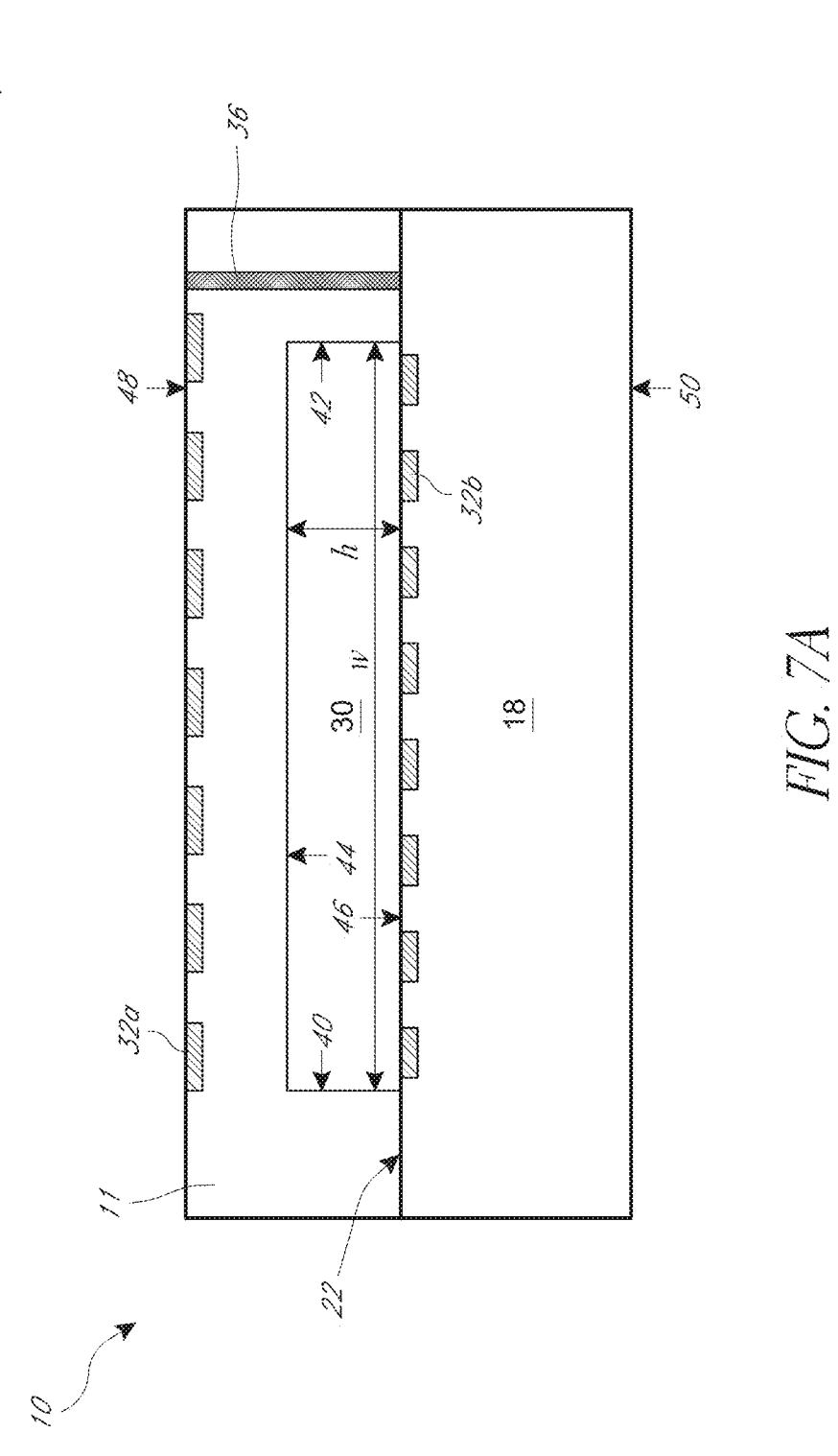
FIG. 7A is a schematic cross-sectional view of an integrated device package having a first antenna structure on or near the top surface of the element and a second antenna structure on or near the lower surface of the cavity.

FIG. 7A is a schematic cross-sectional view of an integrated device package 1 having a first antenna structure 32a at or near the top surface 48 of the element 10 and a second antenna structure 32b at or near the lower surface 46 of the cavity 30. Unless otherwise noted, the components of FIG. 7A may be the same as or generally similar to like-numbered components of FIGS. 1A to 6C. In some embodiments, the first and second antenna structures 32a, 32b can be electrically connected to define one antenna structure. For example the interconnect 36 can connect to the antenna structure 32a, 32b by way of respective conductive traces formed in the element 10 and/or the die 18. In some embodiments, the first antenna structure 32a can comprise a parasitic patch and the second antenna structure 32b can comprise a feed patch. The second antenna structure 32b can be connected to a feeding via or a trace with an excitation signal. In some embodiments, the first antenna structure 32a can be driven by a resonant radiation signal from the second antenna structure 32b. In some embodiments, an arrangement of the cavity 30 between the first and second antenna structures 32a, 32b can enhance the signal resonant radiation, such that the gains and/or bandwidth may be improved.

Figure 7B:
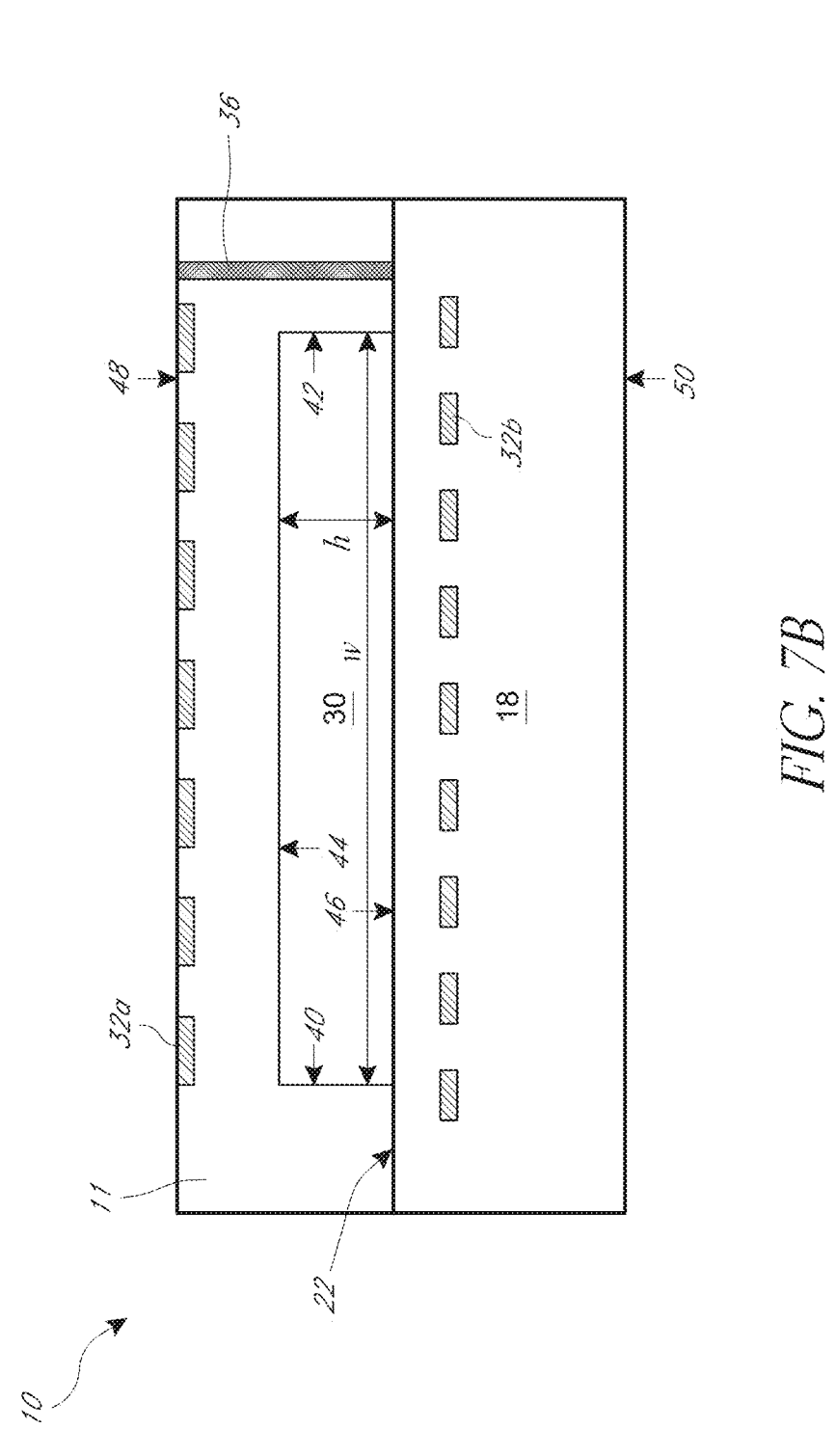
FIG. 7B is a schematic cross-sectional view of an integrated device package 1 having a first antenna structure on or near the top surface of the element and a second antenna structure under the lower surface of the cavity.

FIG. 7B is a schematic cross-sectional view of an integrated device package 1 having a first antenna structure 32a and a second antenna structure 32b. Unless otherwise noted, the components of FIG. 7B may be the same as or generally similar to like-numbered components of FIGS. 1A to 7A. Unlike the embodiment illustrated in FIG. 7A, the second antenna structure 32b of the integrated device package 1 of FIG. 7B is disposed under the lower surface 46 of the cavity 30, such that the second antenna structure 32b is embedded in the die 18. For example, the element 10 can comprise a frame having a plurality of frame portions bonded together as shown in FIG. 2 and the second antenna structure 32b may be disposed between the third portion 16 (see, for example, FIG. 2) and the die 18. In some embodiments, the first antenna structure 32a may be disposed near the upper surface 44 of the cavity or anywhere between the top surface 48 of the element 11 and the upper surface 44 of the cavity 33.

Figure 8:
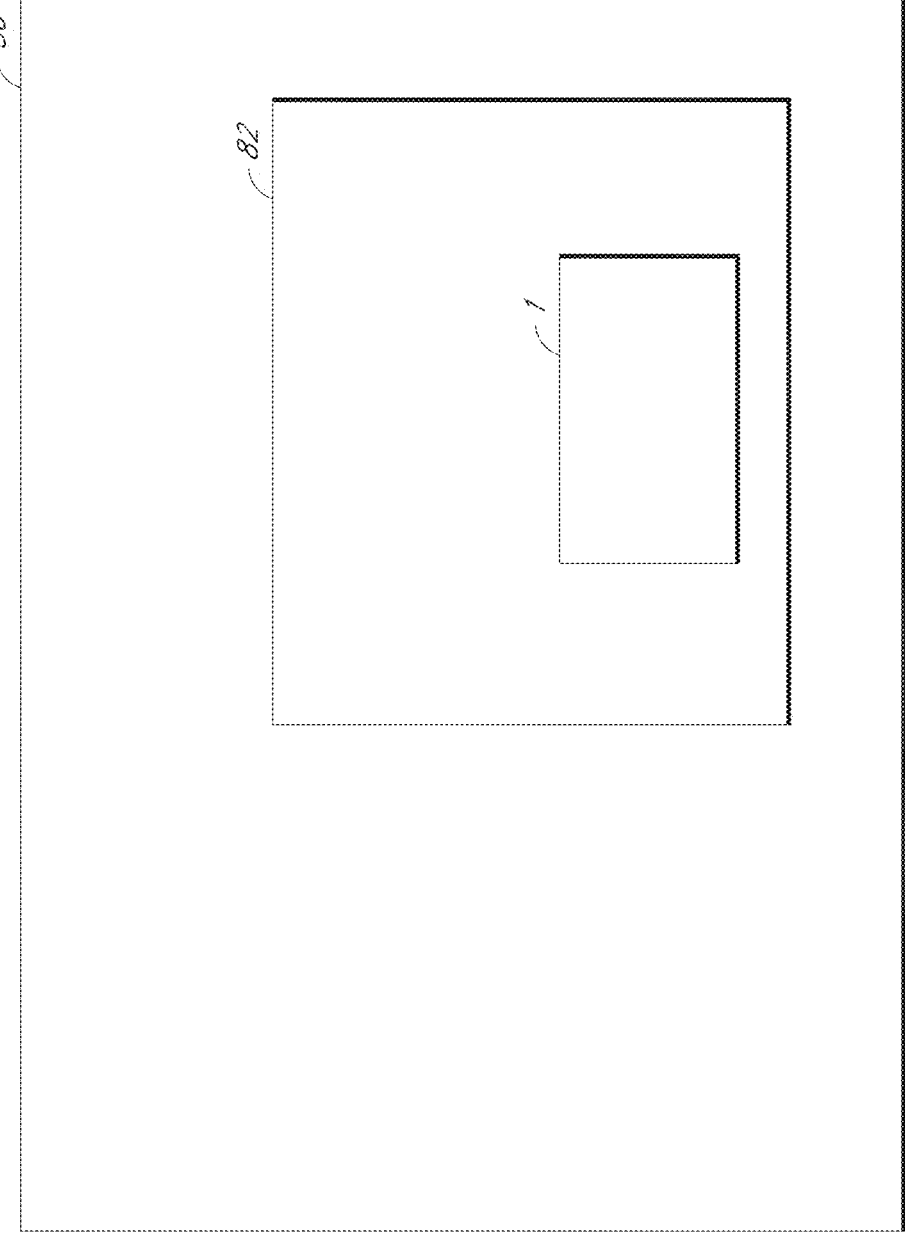
FIG. 8 is a schematic diagram of an electronic system incorporating one or more bonded structures, according to various embodiments.

FIG. 8 is a schematic diagram of an electronic system 80 incorporating one or more integrated device packages 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more integrated device packages 1. The system 80 shown in FIG. 8 can comprise any of the integrated device packages 1 and associated seals shown and described herein.

In one aspect, an integrated device package is disclosed. The integrated device package includes an integrated device die and an element. The element comprises an antenna structure. The element is attached to a surface of the integrated device die. The integrated device package also includes a cavity that is disposed between the integrated device die and at least a portion of the antenna structure. The integrated device package further includes an electrical interconnect that connects the integrated device die and the antenna structure.

In one embodiment, the element includes a frame that is directly bonded to the integrated device die without an intervening adhesive. The frame can include silicon. The integrated device die can include radio-frequency (RF) circuitry. The cavity can be defined by the element and the integrated device die. The cavity can be defined by a planar device die surface and a recess in the element. The recess can be formed by etching a portion of the element. The cavity can be defined by a planar element surface and the recess in the element. The integrated device die can be mounted on a package substrate. The integrated device package can further include a metal layer disposed in the cavity. The frame can include a plurality of frame portions bonded together.

In one embodiment, the cavity is filled with air.

In one embodiment, the integrated device package further includes a resonator that is at least partially disposed in the cavity.

In one embodiment, the cavity includes a first wall surface indicative of an etching process. The cavity can include a second wall. The first wall and the second wall can comprise two opposing sides of the cavity. The cavity can have a width from the first wall to the second wall. The width can be dimensioned to receive or transmit electromagnetic radiation at a frequency range of 24 GHz to 128 GHz. The width can be in a range of 0.5 mm to 12 mm. The first and second walls can be constructed such that the dimension has a maximum roughness in a range of 1 μm to 2 μm. The first and second walls can be constructed such that the dimension has a maximum roughness in a range of 0.1 μm to 1 μm.

In one embodiment, the antenna structure is disposed on or near an upper surface of the cavity or a top surface of the element away from the cavity.

In one embodiment, the antenna structure comprises a parasitic patch and a feed patch. The portion of the antenna structure can comprise the parasitic patch and the cavity can be disposed between the parasitic patch and the feed patch. The parasitic patch and the feed patch can be in electrical connection.

In one aspect, an integrated device package is disclosed. The integrated device package includes a package housing that comprises a semiconductor material. The package housing includes an integrated device, an antenna structure, and a cavity that is disposed between the integrated device and at least a portion of the antenna structure. The integrated device package also includes an electrical interconnect that connects the integrated device and the antenna structure.

In one embodiment, the semiconductor material comprises silicon.

In one embodiment, the cavity is formed by etching the semiconductor material.

In one embodiment, the antenna structure includes a plurality of antennas.

In one embodiment, the package housing includes a plurality of housing portions bonded together.

In one aspect, a method of manufacturing an integrated device package is disclosed. The method includes forming a recess in a semiconductor element comprising an antenna structure, and bonding the semiconductor element with an integrated device die such that the recess is disposed between the antenna structure and the integrated device die.

In one embodiment, the forming the recess includes etching a portion of the semiconductor element.

In one embodiment, the forming the recess includes coating portions of the recess with metal. The etching the portion can include etching a frame portion comprising silicon of the semiconductor element.

In one embodiment, the bonding the semiconductor element with the integrated device die includes bonding the semiconductor element directly to the integrated device die without an intervening adhesive.

In one embodiment, the bonding the semiconductor element with the integrated device die includes making an electrical connection between interconnects comprised in the semiconductor element and the integrated device die.

In one embodiment, the forming the recess also includes filling the recess with air.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. An integrated device package comprising:

an integrated device die; and an element comprising an antenna structure, the element directly bonded to a surface of the integrated device die without an intervening adhesive, wherein an interface between the element and the surface of the integrated device die comprises a dielectric-to-dielectric direct bond.

2. The integrated device package of claim 1, wherein the element comprises silicon or glass.

3. The integrated device package of claim 1, further comprising a cavity disposed between the integrated device die and at least a portion of the antenna structure.

4. The integrated device package of claim 3, wherein the cavity is defined by the element and the integrated device die.

5. The integrated device package of claim 3, wherein the cavity is defined by a planar upper surface of the integrated device die and a recess in the element, or a planar surface of the element and a recess in the integrated device die.

6. The integrated device package of claim 3, wherein at least a portion of the integrated device die defines a majority of a bottom surface of the cavity.

7. The integrated device package of claim 3, wherein the cavity is filled with air.

8. The integrated device package of claim 3, wherein the cavity comprises a first wall having a wall surface indicative of an etching process.

9. The integrated device package of claim 3, wherein the cavity comprises a first wall and a second wall, the first wall and the second wall comprising two opposing sides of the cavity, the cavity having a width from the first wall to the second wall, the width being dimensioned to receive or transmit electromagnetic radiation at a frequency in a range of 24 GHz to 128 GHz, wherein the width is in a range of 0.5 mm to 12 mm.

10. The integrated device package of claim 3, wherein a wall of the cavity is constructed such that a surface roughness of the wall has a maximum roughness in a range of 0.1 $\mu$m to 2 $\mu$m.

11. The integrated device package of claim 3, wherein the antenna structure is disposed on or near an upper surface of the cavity, or on or near a top surface of the element away from the cavity.

12. The integrated device package of claim 3, further comprising a metal layer disposed in the cavity.

13. The integrated device package of claim 1, wherein the integrated device die comprises radio-frequency (RF) circuitry.

14. The integrated device package of claim 1, further comprising an electrical interconnect connecting the integrated device die and the antenna structure.

15. The integrated device package of claim 14, wherein the electrical interconnect is directly and electrically connected to the integrated device die.

16. The integrated device package of claim 1, wherein the element comprises a plurality of frame portions bonded together.

17. The integrated device package of claim 1, wherein the antenna structure comprises a parasitic patch and a feed patch.

18. The integrated device package of claim 1, wherein the integrated device die comprises one or more metal pads, wherein the element comprises an electrical interconnect, and wherein the integrated device die and the element are hybrid bonded to form an electrical connection between the electrical interconnect and the one or more metal pads.

19. The integrated device package of claim 1, wherein the integrated device die and the element are hybrid bonded.

20. The integrated device package of claim 15, wherein the element comprises a first frame portion directly bonded to a second frame portion, and wherein the second frame portion is directly bonded to the surface of the integrated device die.

* * * * *